(12) United States Patent
Goto et al.

(10) Patent No.: US 9,640,762 B2
(45) Date of Patent: May 2, 2017

(54) METHOD FOR PRODUCING TRANSPARENT ELECTRODE AND ORGANIC EL ELEMENT

(71) Applicant: Konica Minolta, Inc., Tokyo (JP)

(72) Inventors: Masaki Goto, Hino (JP); Akihiko Takeda, Sagamihara (JP); Toshiyuki Matsumura, Sagamihara (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/646,981

(22) PCT Filed: Oct. 3, 2013

(86) PCT No.: PCT/JP2013/076921
§ 371 (c)(1),
(2) Date: May 22, 2015

(87) PCT Pub. No.: WO2014/083938
PCT Pub. Date: Jun. 5, 2014

(65) Prior Publication Data
US 2015/0311443 A1 Oct. 29, 2015

(30) Foreign Application Priority Data

Nov. 28, 2012 (JP) .................................. 2012-259838

(51) Int. Cl.
*H01L 51/00* (2006.01)
*H01L 51/44* (2006.01)
(Continued)

(52) U.S. Cl.
CPC ...... *H01L 51/0021* (2013.01); *H01L 51/0022* (2013.01); *H01L 51/5215* (2013.01);
(Continued)

(58) Field of Classification Search
CPC .................. H01L 51/0021; H01L 51/5215
(Continued)

(56) References Cited

U.S. PATENT DOCUMENTS

| 6,710,306 B2 * | 3/2004 | Hahn | ...................... C03B 29/12 |
| | | | 219/388 |
| 2008/0129193 A1 * | 6/2008 | Asabe | ................... H05B 33/28 |
| | | | 313/504 |

(Continued)

FOREIGN PATENT DOCUMENTS

| JP | H02145672 A | 6/1990 |
| JP | H0680442 A | 3/1994 |

(Continued)

OTHER PUBLICATIONS

English Translation of JP2012155887(A).*
(Continued)

*Primary Examiner* — Christine Enad
(74) *Attorney, Agent, or Firm* — Lucas & Mercanti, LLP

(57) ABSTRACT

A method for producing a transparent electrode includes a forming step, an applying step and an irradiating step. The forming step is a step of forming a conductive metal layer on a transparent resin substrate. The applying step is a step of applying a composition containing a conductive polymer and a nonconductive polymer over the transparent resin substrate and the conductive metal layer so as to form a conductive polymer layer. The irradiating step is a step of irradiating the conductive polymer layer with an infrared ray having a ratio of spectral radiance at a wavelength of 5.8 μm to spectral radiance at a wavelength of 3.0 μm of 5% or less.

2 Claims, 7 Drawing Sheets

(51) Int. Cl.
  *H01L 51/52* (2006.01)
  *H05B 33/10* (2006.01)
  *H05B 33/28* (2006.01)
(52) U.S. Cl.
  CPC ............ *H05B 33/10* (2013.01); *H05B 33/28* (2013.01); *H01L 51/5234* (2013.01)
(58) Field of Classification Search
  USPC .......................................................... 257/40
  See application file for complete search history.

(56) References Cited

U.S. PATENT DOCUMENTS

| | | | | |
|---|---|---|---|---|
| 2009/0282949 | A1* | 11/2009 | Seals | B23K 35/325 75/302 |
| 2010/0255323 | A1* | 10/2010 | Nakamura | H01B 1/22 428/457 |
| 2010/0307791 | A1* | 12/2010 | Kim | H01B 1/128 174/126.1 |
| 2012/0328272 | A1* | 12/2012 | Fujita | F26B 3/30 392/416 |

FOREIGN PATENT DOCUMENTS

| | | | |
|---|---|---|---|
| JP | H06273964 | A | 9/1994 |
| JP | H0864132 | A | 3/1996 |
| JP | 2004165140 | A | 6/2004 |
| JP | 2006337545 | A | 12/2006 |
| JP | 4790092 | B1 | 10/2011 |
| JP | 2012155887 | A | 8/2012 |
| JP | WO 2013047660 | A1 * | 4/2013 ........... H01L 51/445 |

OTHER PUBLICATIONS

English Translation of WO2011/136041 A1.*
The International Preliminary Report on Patentability dated Jun. 2, 2015 from the corresponding International Patent Application No. PCT/JP2013/076921.
English translation of the International Preliminary Report on Patentability dated Jun. 2, 2015 from the corresponding International Patent Application No. PCT/JP2013/076921.
The Written Opinion of the International Searching Authority dated Oct. 29, 2013 from the corresponding International Patent Application No. PCT/JP2013/076921.
English translation of the Written Opinion of the International Searching Authority dated Oct. 29, 2013 from the corresponding International Patent Application No. PCT/JP2013/076921.
International Search Report dated Oct. 29, 2013 for Application No. PCT/JP2013/076921.

* cited by examiner

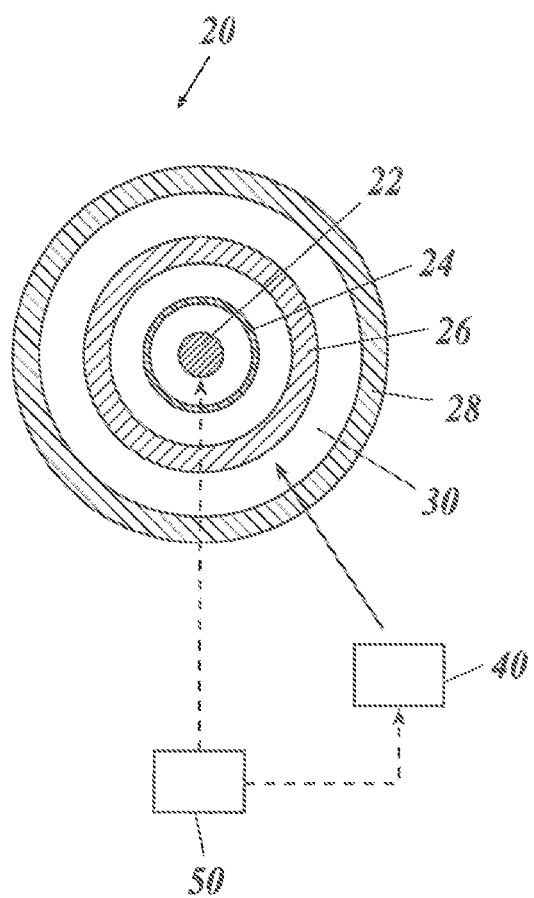

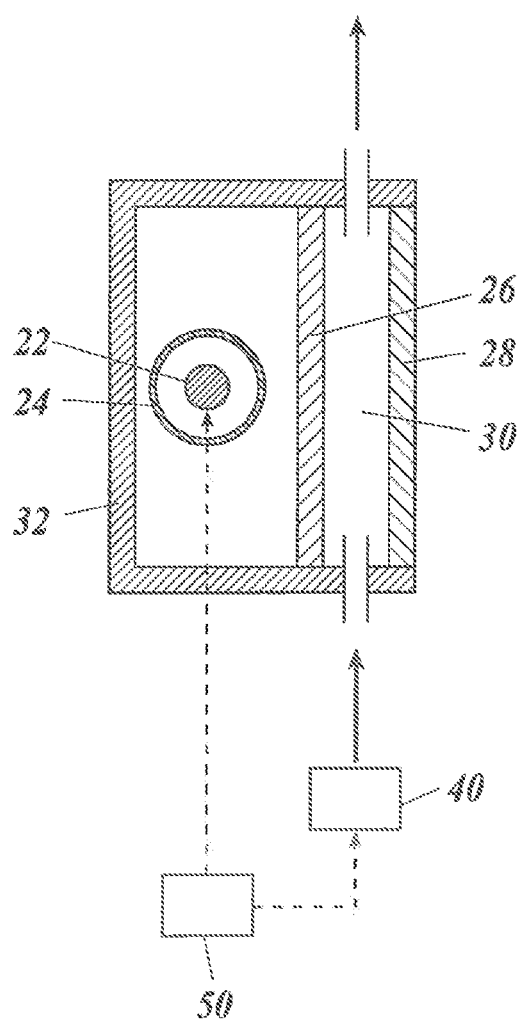

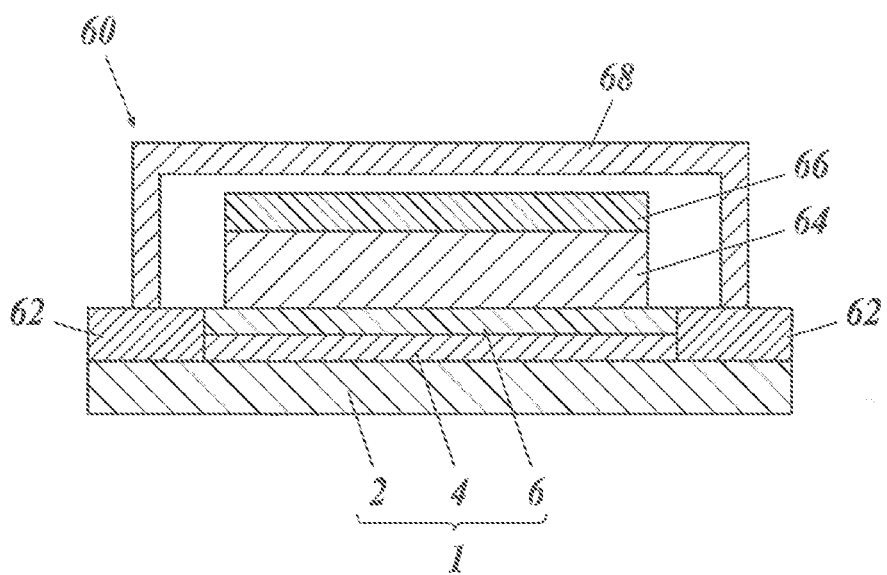

METHOD FOR PRODUCING TRANSPARENT ELECTRODE AND ORGANIC EL ELEMENT

CROSS REFERENCE TO RELATED APPLICATION

This Application is a 371 of PCT/JP2013/076921 filed on Oct. 3, 2013 which, in turn, claimed the priority of Japanese Patent Application No. JP2012-259838 filed on Nov. 28, 2012, both applications are incorporated herein by reference.

TECHNICAL FIELD

The present invention relates to a method for producing a transparent electrode suitably used in various fields, such as liquid crystal display elements, organic luminescent elements, inorganic electroluminescent elements, solar cells, electromagnetic shields, electronic paper and touch panels, and in particular relates to a method for producing a transparent electrode of an organic luminescent element.

BACKGROUND ART

With recent growing demand for flat-screen TVs, display technologies of various styles, including those making use of liquid crystal, plasma, organic electroluminescence and field emission, have been developed. For any of these displays of different display styles, a transparent electrode is an essential technology. Besides televisions, a transparent electrode is indispensable for touch panels, mobile phones, electronic paper, various solar cells and various electroluminescence control elements.

A conventional transparent electrode having been most widely used is an ITO transparent electrode produced by forming an indium-tin composite oxide (ITO) film by vacuum deposition or sputtering on a transparent substrate composed of glass, a transparent plastic film or the like. However, it has been desired to disuse indium because indium is a rare metal and its price has been soaring. There also has been desired a production technology of roll-to-roll using a flexible substrate (flexible transparent substrate), such as a resin substrate, for larger screens of displays and for improvement in productivity.

To form a transparent conductive layer, instead of the dry application methods such as vacuum deposition and sputtering, which are low in productivity, there have been developed wet application methods each for forming a transparent electrode by directly applying a dispersion containing conductive particles of a metal, metal oxide, conductive polymer or the like onto a transparent substrate and drying the same (Refer to, for example, Patent Documents 1 and 2.)

However, the wet treatment of applying and drying the dispersion raises new problems which lead to performance decrease of a transparent electrode. That is, when the dispersion containing conductive particles is dried after being applied to form a transparent conductive layer, uneven temperature and uneven drying of the coating film (applied layer) occur, which reduces thickness distribution and surface smoothness of the transparent conductive layer, thickens the applied edge part, called coffee-ring, and causes poor patterning by drying shrinkage. These lead to, when it is used as an electrode of an organic electroluminescent element (organic EL element), significant performance decrease of the element, such as increase in electrode surface resistance and occurrence of current leakage.

To deal with these problems, there are methods for increasing the drying speed and reducing the above unevenness. Examples thereof include: a method of increasing a drying temperature of conductive heat transfer drying with hot air, a hot plate or the like; and a method of carrying out radiation heat transfer drying with an infrared heater or the like. (Refer to, for example, Patent Document 3.)

However, in the case of the conductive heat transfer drying at a high temperature, when a transparent resin substrate is used as a transparent substrate, the drying treatment cannot be carried out at a temperature higher than a grass transition temperature (Tg) of the resin material because it deforms the substrate itself. Further, in a general infrared heater, when radiation energy at a wavelength of 3.0 μm, which is an adsorption region of a solvent such as water or alcohol, is increased, radiation energy at a wavelength of 5.8 μm or more, which corresponds to an absorption region of a general transparent resin substrate, is also increased, which deforms the substrate itself as with the conductive heat transfer drying at a high temperature.

As a method for effectively utilizing the radiation energy at a wavelength of 3.0 μm, there has been proposed a method using an infrared heater which absorbs infrared rays having a wavelength of 3.5 μm or more. (Refer to, for example, Patent Document 4.)

However, the main purpose of this method is to efficiently dry a solvent in an applied layer, not giving consideration to prevention of deformation of a substrate caused by the substrate itself absorbing infrared rays. In particular, infrared drying in the case where a transparent resin substrate is used is not mentioned therein.

By the way, in an organic EL element, moisture remaining in the element significantly degrades an organic layer, so that a transparent electrode and a transparent resin substrate need to be highly dried.

Usually, on a transparent resin substrate, a barrier layer is formed. Even under the drying conditions which do not clearly deform the substrate itself, the substrate may be partially infinitesimally deformed, which may separate or degrade the barrier layer. When such a transparent electrode is used in an organic EL element, the barrier function decreases and the organic layer deteriorates, which becomes a factor to cause emission unevenness and, by extension, generate dark spots.

As described above, for a transparent electrode using a transparent resin substrate for an organic EL element, high thickness uniformity, high smoothness, accurate patterning and a high degree of drying of a conductive layer as well as a high barrier property are required. It is, however, difficult for the conventional drying methods to satisfy them concurrently.

RELATED ART DOCUMENTS

Patent Documents

Patent Document 1: Japanese Patent Application Publication No. 6-80442
Patent Document 2: Japanese Patent Application Publication No. 6-273964
Patent Document 3: Japanese Patent Application Publication No. 2006-337545
Patent Document 4: Japanese Patent No. 4790092

SUMMARY OF THE INVENTION

Problems to be Solved by the Invention

Therefore, the main object of the present invention is to provide a method for producing a transparent electrode, the method satisfying thickness uniformity, smoothness and patterning accuracy of a transparent conductive layer and also highly drying the transparent conductive layer without deforming a transparent resin substrate in the case where a transparent electrode using a transparent resin substrate is produced.

Another object of the present invention is to provide an organic EL element using the transparent electrode, the organic EL element having excellent emission uniformity, hardly degrading the emission uniformity even under the environment of a high temperature and a high humidity and having excellent element driving efficiency and emission lifetime.

Means for Solving the Problems

In order to solve the above problems, according to a first aspect of the present invention, there is provided a method for producing a transparent electrode including: a step of forming a conductive metal layer on a transparent resin substrate; a step of applying a composition containing a conductive polymer and a nonconductive polymer over the transparent resin substrate and the conductive metal layer so as to form a conductive polymer layer; and a step of irradiating the conductive polymer layer with an infrared ray having a ratio of spectral radiance at a wavelength of 5.8 μm to spectral radiance at a wavelength of 3.0 μm of 5% or less.

According to a second aspect of the present invention, there is provided an organic EL element including: a transparent electrode produced by the above method for producing a transparent electrode; a counter electrode facing the transparent electrode; and an organic functional layer disposed between the transparent electrode and the counter electrode.

Advantageous Effects of the Invention

According to the first aspect of the present invention, there can be provided a method for producing a transparent electrode, the method satisfying thickness uniformity, smoothness and patterning accuracy of a transparent conductive layer and also highly drying the transparent conductive layer without deforming a transparent resin substrate.

According to the second aspect of the present invention, there can be provided an organic EL element having excellent emission uniformity, hardly degrading the emission uniformity even under the environment of a high temperature and a high humidity and having excellent element driving efficiency and emission lifetime.

BRIEF DESCRIPTION OF THE DRAWINGS

FIG. 3 is a cross-sectional view showing a schematic structure of an infrared heater.

FIG. 4 is a cross-sectional view showing a modification of the infrared heater.

FIG. 5 is a cross-sectional view showing a schematic structure of an organic EL element.

EMBODIMENTS FOR CARRYING OUT THE INVENTION

Hereinafter, a preferred embodiment of the present invention is described with reference to the drawings.

<<Transparent Electrode (1)>>

A transparent electrode has a conductive polymer layer containing at least a conductive polymer and a nonconductive polymer on a transparent resin substrate. The conductive polymer layer can be produced by applying a dispersion composed of the conductive polymer and the nonconductive polymer onto the transparent resin substrate and drying the same.

Figure 1:
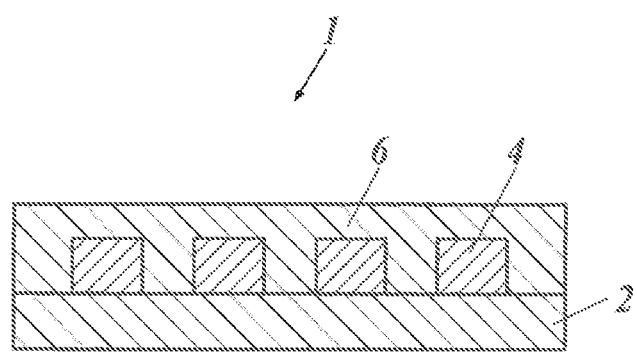
FIG. 1 is a cross-sectional view showing a schematic structure of a transparent electrode.

The structure of the transparent electrode is shown in FIG. 1.

As shown in FIG. 1, a transparent electrode 1 is mainly composed of a transparent resin substrate 2, a conductive metal layer 4 and a conductive polymer layer 6.

Figure 2A:
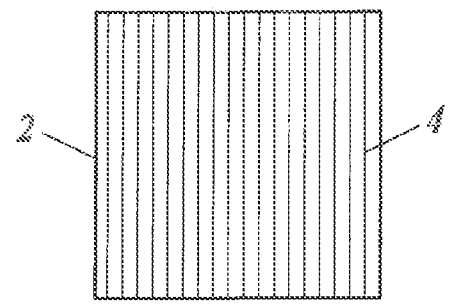
FIG. 2A is a plan view showing a pattern of a conductive metal layer of the transparent electrode.
Figure 2B:
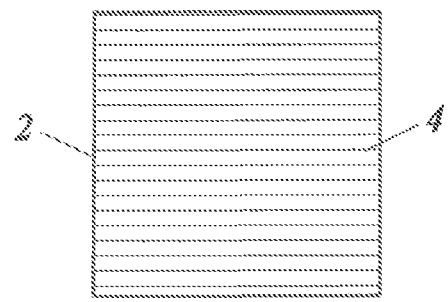
FIG. 2B is a plan view showing a pattern of the conductive metal layer of the transparent electrode.
Figure 2C:
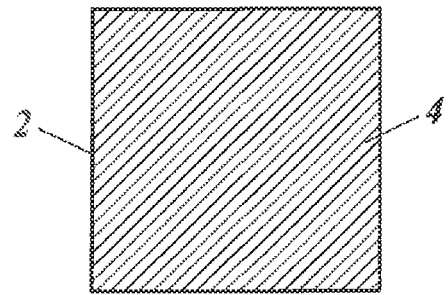
FIG. 2C is a plan view showing a pattern of the conductive metal layer of the transparent electrode.
Figure 2D:
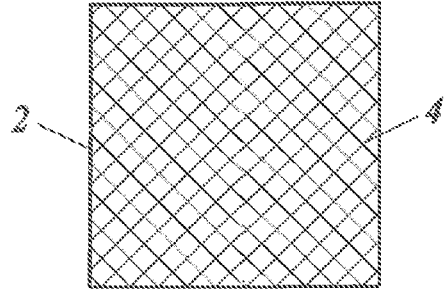
FIG. 2D is a plan view showing a pattern of the conductive metal layer of the transparent electrode.

On the transparent resin substrate 2, the conductive metal layer 4 composed of metal particles and having a thin wire pattern is formed. In the conductive metal layer 4, thin wires composed of metal particles may be formed to be striped as shown in FIGS. 2A to 2C or may be formed to be meshed (a network) as shown in FIG. 2D.

On the conductive metal layer 4, the conductive polymer layer 6 is formed. The conductive polymer layer 6 is uniformly formed and covers the front side of the conductive metal layer 4 and the front side of the transparent resin substrate 2 exposed from the conductive metal layer 4.

In the transparent electrode 1, the conductive metal layer 4 and the conductive polymer layer constitute the so-called transparent conductive layer, and as described above, the conductive polymer layer 6 is disposed on the conductive metal layer 4, and using them together achieves low resistance and uniform surface resistance.

<<Transparent Resin Substrate (2)>>

A transparent resin substrate is a sheet-type article capable of holding thereon conductive layers. In order to produce a transparent electrode, the transparent resin substrate used by preference has a total luminous transmittance in the visible light wavelength region of 80% or more determined by a method in conformity with JIS K 7361-1:1997 (Plastics—Determination of the Total Luminous Transmittance of Transparent Materials).

Preferable examples of the transparent resin substrate include a resin substrate and a resin film. It is preferable to use a transparent resin film in terms of productivity and properties such as lightness in weight and flexibility. The transparent resin film is one having a total luminous transmittance in the visible light wavelength region of 50% or more determined by the method in conformity with JIS K 7361-1:1997 (Plastics—Determination of the Total Luminous Transmittance of Transparent Materials).

The transparent resin film usable by preference is not particularly limited, and its material, shape, structure, thickness and so forth are suitably selectable from publicly-known ones.

Examples thereof include: polyester resin films of polyethylene terephthalate (PET), polyethylene naphthalate, modified polyester, etc.; polyethylene (PE) resin films; polypropylene (PP) resin films; polystyrene resin films; polyolefin resin films of cyclic olefin resin, etc.; vinyl resin films of polyvinyl chloride, polyvinylidene chloride, etc.; polyether ether ketone (PEEK) resin films; polysulfone (PSF) resin films; polyethersulfone (PES) resin films; polycarbonate (PC) resin films; polyamide resin films; polyimide resin films; acrylic resin films; and triacetylcellulose (TAC) resin films.

Any of the resin films having a total luminous transmittance of 80% or more is preferably used as the transparent resin substrate used in the present invention. Of these, in terms of transparency, infrared absorption, handleability, strength and costs, polyester resin films are preferable, and a biaxially oriented polyethylene terephthalate film and a biaxially oriented polyethylene naphthalate film are far preferable.

The transparent resin substrate used in the present invention can be surface-treated or provided with an easy adhesion layer in order to ensure wettability and adhesiveness of an application liquid. Publicly-known technologies are usable for the surface treatment and the easy adhesion layer.

Examples of the surface treatment include surface activation treatments such as corona discharge treatment, flame treatment, ultraviolet treatment, high frequency treatment, glow discharge treatment, activated plasma treatment and laser treatment.

Examples of the easy adhesion layer include polyester, polyamide, polyurethane, vinyl copolymers, butadiene copolymers, acrylic copolymers, vinylidene copolymers and epoxy copolymers. The easy adhesion layer may be composed of a single layer or, in order to improve adhesiveness, may be composed of two or more layers.

On the front side or the back side of the film substrate of the present invention, a barrier layer which is composed of a coating composed of an inorganic matter or an organic matter or a hybrid coating composed of these is preferably formed.

<<Barrier Layer>>

An organic electronic element (described below) such as an organic EL element easily degrades its performance with presence of a small amount of moisture or oxygen in the element. It is effective to form on a transparent resin substrate a barrier layer having a high shielding property against moisture and oxygen in order to prevent moisture and oxygen from diffusing into the element through the transparent resin substrate.

The composition, structure and forming method of the barrier layer are not particularly limited. The barrier layer can be formed by forming a layer composed of an inorganic compound such as silica by vacuum deposition or CVD. Alternatively, the barrier layer may be formed by applying and drying an application liquid containing a polysilazane compound and then carrying out oxidation treatment by ultraviolet irradiation under a nitrogen atmosphere containing oxygen and water vapor.

As the method for applying a polysilazane compound, an appropriate method can be selected. Examples thereof include various types of coating such as roller coating, bar coating, dip coating, spin coating, casting, die coating, blade coating, curtain coating, spray coating, doctor coating and flow coating and various types of printing such as gravure printing, flexographic printing, offset printing, screen printing and inkjet printing.

In the case where the barrier layer is preferably formed in a pattern, any of gravure printing, flexographic printing, offset printing, screen printing and inkjet printing is preferably used.

Polysilazane used in the present invention is a polymer having a silicon-nitrogen bond and is a ceramic precursor inorganic polymer exemplified by: $SiO_2$ composed of, for example, Si—N, Si—H and N—H; $Si_3N_4$; and their intermediate solid solution $SiO_xN_y$.

In the case where a resin substrate is used, as described in Japanese Patent Application Publication No. 8-112879, one which is modified to silica by becoming ceramic at a relatively low temperature is preferable, and one represented by the following General Formula (A) can be preferably used.

[Chem. 1]

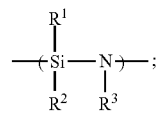

General Formula (A)

In General Formula (A), R1, R2 and R3 each represent a hydrogen atom, an alkyl group, an alkenyl group, a cycloalkyl group, an aryl group, an alkylsilyl group, an alkylamino group or an alkoxy group.

For perhydropolysilazane, R1, R2 and R3 are all hydrogen atoms, and for organopolysilazane, at least one of R1, R2 and R3 is an alkyl group, an alkenyl group, a cycloalkyl group, an aryl group, an alkylsilyl group, an alkylamino group or an alkoxy group. In terms of compactness as the barrier layer to be produced, perhydropolysilazane, for which R1, R2 and R3 are all hydrogen atoms, is particularly preferable.

The barrier layer may be composed of a single layer or have a multilayer structure composed of two or more layers. In the case where the barrier layer has the multilayer structure, the multilayer structure may be composed of an inorganic compound or formed as a hybrid coating composed of an inorganic compound and an organic compound, and a stress relief layer may be inserted into the barrier layer.

Regardless of a single layer or layers stacked, the thickness of one barrier layer is preferably 30 nm to 1,000 nm, far preferably 30 nm to 500 nm and particularly preferably 90 nm to 500 nm. When the thickness is 30 nm or more, thickness uniformity is excellent, and an excellent barrier property is obtained, whereas when the thickness is 1,000 nm or less, it hardly happens that cracks are suddenly made by bending, and the internal stress in film forming is kept from increasing, so that defects can be prevented from being generated.

As the barrier property of the barrier layer, it is preferable that a water vapor permeability (25±0.5° C. and a relative humidity of (90±2)% RH) determined by a method in conformity with JIS K 7129-1992 be $1 \times 10^{-3}$ g/(m²·24 h) or less, and far preferable that an oxygen permeability determined by a method in conformity with JIS K 7126-1987 be $1 \times 10^{-3}$ ml/m²·24 h·atm or less (1 atm is $1.01325 \times 10^5$ Pa)

and the water vapor permeability (25±0.5° C. and a relative humidity of (90±2)% RH) be $1\times10^{-3}$ g/(m$^2 \cdot$24 h) or less.

Before the barrier layer is formed, pretreatment may be carried out on the surface of the transparent resin substrate with a silane coupling agent or the like in order to improve adhesiveness to the transparent resin substrate.

<<Conductive Metal Layer (4)>>

As described above, a conductive metal layer is a layer formed of a metal material and takes on a certain pattern.

The metal material is not particularly limited as long as it has conductivity. Examples thereof include metals, such as gold, silver, copper, iron, cobalt, nickel and chromium, and alloys. In terms of conductivity, silver and copper are preferable, and silver is far preferable.

The conductive metal layer is formed in a pattern having an open part on a transparent resin substrate so as to form a transparent electrode. The open part is a part having no metal material on the transparent resin substrate and serves as a translucent window part.

The pattern is not particularly limited and therefore the conductive part may be striped (FIGS. 2A to 2C), latticed (FIG. 2D) or a random network, but an open area ratio is preferably 80% or more in terms of transparency.

The open area ratio is a ratio of the translucent window part, which is the conductive metal layer excluding the part where light is not transmitted, to the whole. For example, in the case where the conductive metal layer is striped or latticed, the open area ratio of a stripe pattern having a wire width of 100 μm and a wire interval of 1 mm is approximately 90%.

The wire width of the pattern is preferably 10 to 200 μm. When the wire width of a thin wire (s) is 10 μm or more, a desired level of conductivity can be obtained, whereas when the wire width thereof is 200 μm or less, transparency can be prevented from decreasing.

The height of the thin wire is preferably 0.1 to 10 μm. When the height of the thin wire is 0.1 μm or more, a desired level of conductivity can be obtained, whereas when the height thereof is 10 μm or less, current leakage and poor thickness distribution of a functional layer in forming an organic electronic device can be prevented from occurring.

A method for forming an electrode having the stripe or lattice conductive part is not particularly limited, and therefore a publicly-known method can be used therefor.

The electrode can be formed, for example, by forming a metal layer over the entire surface of a transparent resin substrate and subjecting it to photolithography, which is publicly known. More specifically, after a conductive layer is formed over the entire surface of the front side of a transparent resin substrate by one or two or more physically- or chemically-forming methods such as printing, vapor deposition, sputtering and plating, or after a metal foil is disposed on a transparent resin substrate with an adhesive, it is etched by the publicly-known photolithography, thereby being processed to be striped or latticed as desired.

Other usable methods include printing in a desired pattern, such as relief printing, intaglio printing, screen printing or the inkjet method, using a metal particle dispersion; application in a desired pattern by relief printing, intaglio printing, screen printing or the inkjet method, using a catalyst ink capable of being plated, followed by plating; and a method making use of a silver halide photographic technology. The method making use of a silver halide photographic technology can be implemented, for example, with reference to Paragraphs [0076] to [0112] and Examples of Japanese Patent Application Publication No. 2009-140750. The method of gravure printing with a catalyst ink followed by plating can be implemented, for example, with reference to Japanese Patent Application Publication No. 2007-281290.

Metal particles contained in the metal particle dispersion are preferably nanoparticles in terms of patterning accuracy and so forth. The average particle size of the metal nanoparticles is preferably in a range from 1 to 100 nm, far preferably in a range from 1 to 50 nm and particularly preferably in a range from 1 to 30 nm.

The average particle size of the metal nanoparticles is obtained as follows: of metal nanoparticles observed under an electron microscope, 200 or more metal nanoparticles which are observable as circles, ovals, substantial circles or substantial ovals are observed at random; the particle size of each of the metal nanoparticles is obtained; and the number average value thereof is obtained.

Here, the particle size indicates the shortest distance among distances between two parallel lines between which the outer edge of a metal nanoparticle, which is observable as a circle, an oval, a substantial circle or a substantial oval, is sandwiched. When the average particle size is determined, the particle size which clearly represents a side face or the like of a metal nanoparticle is not included for the determination.

As a method for producing the metal nanoparticle dispersion, many proposals have been made and detailed, for example, in Japanese Patent Application Publication Nos. 2010-265543, 2011-68936, 2012-162767, 2012-144796, 2012-144795, 2012-52225, 2008-214591, 2007-200775, 2006-193594, 2012-119132 and 2011-153362 and Published Japanese Translation of PCT International Publication for Patent Application No. 2009-515023.

The metal nanoparticle dispersion contains metal nanoparticles in a dispersion composed of water, alcohol, hydrocarbon or the like and may contain for example, a binder and/or a dispersant to disperse metal as needed.

The random network structure can be formed, for example, by a method described in Published Japanese Translation of PCT International Publication for Patent Application No. 2005-530005, according to which a disordered network structure of conductive particles is spontaneously formed by applying and drying a liquid containing metal particles.

Another usable method is described, for example, in Published Japanese Translation of PCT International Publication for Patent Application No. 2009-505358, according to which a random network structure of metal nanowires is formed by applying and drying an application liquid containing metal nanowires.

The metal nanowires are fibrous structures mainly composed of a metal element. In particular, the metal nanowires of the present invention mean a large number of fibrous structures having minor axes ranging from the atomic scale to nanometer scale.

The average length of the metal nanowires is, in order to form a long conductive path with a single metal nanowire, preferably 3 μm or more, far preferably 3 to 500 μm and particularly preferably 3 to 300 μm. In addition, the relative standard deviation of the lengths thereof is preferably 40% or less. The average minor axis is not particularly limited, but preferably small in terms of transparency whereas preferably large in terms of conductivity. The average minor axis of the metal nanowires is preferably 10 to 300 nm and far preferably 30 to 200 nm. In addition, the relative standard deviation of the minor axes thereof is preferably 20% or less. The weight per unit area of the metal nanowires is preferably 0.005 to 0.5 g/m$^2$ and far preferably 0.01 to 0.2 g/m$^2$.

Metals usable for the metal nanowires include copper, iron, cobalt, gold and silver. Of these, silver is preferable in terms of conductivity. One type of metal may be used alone, or, in order to achieve both conductivity and stability (sulfation resistance, oxidation resistance and migration resistance of the metal nanowires), one type of metal as a main component may be combined with one or more other types of metal at an arbitrary ratio.

A method for producing the metal nanowires is not particularly limited, and, for example, a publicly-known method such as a liquid-phase method or a vapor-phase method can be used therefor. Its specific production method is not particularly limited either, and a publicly-known production method can be used therefor.

For example, reference can be made to: Adv. Mater., 2002, Vol. 14, pp. 833-837 and Chem. Mater., 2002, Vol. 14, pp. 4736-4745 for a method for producing silver nanowires; Japanese Patent Application Publication No. 2006-233252 and so forth for a method for producing gold nanowires; Japanese Patent Application Publication No. 2002-266007 and so forth for a method for producing copper nanowires; and Japanese Patent Application Publication No. 2004-149871 and so forth for a method for producing cobalt nanowires. In particular, the method for producing silver nanowires can be preferably used because silver nanowires can be simply and easily produced in an aqueous solution and also because silver has the highest conductivity among metals.

Surface resistivity of the thin-wire part composed of a metal material is preferably 100Ω/□ or less and, for the larger ones described above, far preferably 20Ω/□ or less. The surface resistivity is measurable, for example, in conformity with JIS K6911, ASTM D257 or the like and is simply and easily measurable with a commercially-available surface resistivity meter.

It is preferable to carry out heat treatment on the thin-wire part composed of a metal material within an extent of not damaging the film substrate. This is particularly preferable because metal particles or metal nanowires are well fused with each other thereby, and conductivity of the thin-wire part composed of a metal material increases.

As a method for the heat treatment, heating with an oven and heating with a hot plate, which are conventionally carried out, can be used. Alternatively, local heating treatment may be used, and examples thereof include flash pulse irradiation treatment, microwave treatment, plasma treatment, electron induction heating treatment, excimer laser irradiation treatment, ultraviolet treatment, infrared heater treatment and hot air heater treatment. As the heat treatment, heating with an oven or a hot plate and local heating treatment may be both carried out.

The conductive metal layer may be provided with an under layer in order to improve a pattern drawing property and adhesiveness to the base. The under layer is not particularly limited as long as it has optical transparency. For example, an under layer containing organic particles of acrylic resin or inorganic particles of metal oxide may be used. The layer may also contain a binder composed of organic or inorganic resin.

<<Conductive Polymer Layer (6)>>

A conductive polymer layer is basically composed of a conductive polymer and a nonconductive polymer. The nonconductive polymer is basically composed of a self-dispersing polymer and/or a hydroxy group-containing polymer.

The conductive polymer layer composed of a conductive polymer and a nonconductive polymer and the nonconductive polymer composed of a self-dispersing polymer and/or a hydroxy group-containing polymer can reduce a necessary amount of the conductive polymer without reducing conductivity of the conductive polymer layer. Consequently, there can be produced a transparent electrode having both high conductivity and high transparency.

The conductive polymer layer is formed by applying a liquid composition containing a conductive polymer and a nonconductive polymer onto a conductive metal layer composed of thin metal wires so as to form a transparent conductive layer together with the conductive metal layer. Consequently, a transparent electrode can have both high transparency and high conductivity and also can have uniformity in the electrode surface.

The liquid composition containing a conductive polymer and a nonconductive polymer for forming a conductive polymer layer preferably contains an aqueous solvent, a polar solvent and glycol ether in addition to the conductive polymer and the nonconductive polymer. Consequently, the composition can be printed over a substrate at an amount necessary and sufficient for a conductive polymer layer to have high transparency and high conductively.

For the application thereof for a conductive polymer layer, in addition to the above-mentioned printing such as gravure printing, flexographic printing and screen printing, coating such as roller coating, bar coating, dip coating, spin coating, casting, die coating, blade coating, bar coating, gravure coating, curtain coating, spray coating, doctor coating and the inkjet method can be used. In particular, in the case where a conductive polymer layer is disposed on a conductive metal layer, it is preferable that the conductive polymer layer be formed by the inkjet method, and irradiated and dried with an infrared ray(s) of the present invention so that the conductive polymer layer has stable thickness distribution, high surface smoothness and high patterning accuracy.

The electric resistance of the conductive polymer layer is, in surface resistivity, preferably 10,000Ω/□ or less and far preferably 2,000Ω/□ or less in order that the conductive polymer layer in combination with the conductive metal layer allows the transparent electrode to have uniform conductivity.

The dry thickness of the conductive polymer layer is preferably 30 to 2,000 nm. The dry thickness thereof is far preferably 1,000 nm or less in terms of transparency while far probably 100 nm or more in terms of conductivity and still far preferably 200 nm or more in terms of surface smoothness of an electrode.

The composition for forming the conductive polymer layer is detailed.

(1) Conductive Polymer

The "conductive" of the conductive polymer means a state that electricity flows and means that sheet resistance measured by a method in conformity with JIS K 7194, "Testing Method for Resistivity of Conductive Plastics with a Four-Point Probe Array", is less than $1 \times 10^8$ Ω/□.

The conductive polymer of the present invention is a conductive polymer having a π-conjugated conductive polymer and a polyanion. This sort of conductive polymer can be easily produced by subjecting the below-described precursor monomer(s) for forming the π-conjugated conductive polymer to chemical oxidative polymerization under the presence of an appropriate oxidizer, an appropriate oxidation catalyst and the polyanion described below.

(1.1) π-Conjugated Conductive Polymer

The π-conjugated conductive polymer used in the present invention is not particularly limited, and usable examples thereof include chain conductive polymers such as polythiophenes (including simple polythiophene, the same applies to the following), polypyrrols, polyindoles, polycarbazoles, polyanilines, polyacetylenes, polyfurans, polyparaphenylene vinylenes, polyazulenes, polyparaphenylenes, poly-paraphenylene sulfides, polyisothianaphthenes and polythiazyls. Of these, in terms of conductivity, transparency, stability and so forth, polythiophenes and polyanilines are preferable, and polyethylene dioxythiophene is the most preferable.

(1.1.1) Precursor Monomer for π-Conjugated Conductive Polymer

The precursor monomer used for forming the π-conjugated conductive polymer has a π-conjugated system in the molecule, and when the precursor monomer is polymerized by the action of an appropriate oxidizer too, the π-conjugated system is formed in the principal chain. Examples thereof include pyrroles and derivatives thereof, thiophenes and derivatives thereof, and anilines and derivatives thereof.

Specific examples of the precursor monomer include pyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxylpyrrole, 3-methyl-4-carboxylpyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole, thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylene dioxythiophene, 3,4-propylene dioxythiophene, 3,4-butene dioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene, aniline, 2-methylaniline, 3-isobutylaniline, 2-aniline sulfonic acid and 3-aniline sulfonic acid.

(1.2) Polyanion

The polyanion used for the conductive polymer of the present invention is exemplified by: substituted or non-substituted polyalkylene; substituted or non-substituted polyalkenylene; substituted or non-substituted polyimide; substituted or non-substituted polyamide; substituted or non-substituted polyester; and copolymers thereof, and is composed of a structural unit having an anionic group and a structural unit having no anionic group.

The polyanion is a polymer to dissolve or disperse the π-conjugated conductive polymer in a solvent. The anionic group of the polyanion functions as a dopant for the π-conjugated conductive polymer and improves conductivity and heat resistance of the π-conjugated conductive polymer.

The anionic group of the polyanion is any functional group with which the π-conjugated conductive polymer can be doped by chemical oxidation. In particular, a monosubstituted sulfuric acid ester group, a monosubstituted phosphoric acid ester group, a phosphoric acid group, a carboxy group, a sulfo group and so forth are preferable in terms of easiness in producing and stability. In terms of the doping effect of the functional group on the π-conjugated conductive polymer, a sulfo group, a monosubstituted sulfuric acid ester group and a carboxy group are far preferable.

Specific examples of the polyanion include polyvinylsulfonic acid, polystyrenesulfonic acid, polyallylsulfonic acid, polyacrylic acid ethylsulfonic acid, polyacrylic acid butylsulfonic acid, poly-2-acrylamide-2-methylpropanesulfonic acid, polyisoprenesulfonic acid, polyvinylcarboxylic acid, polystyrenecarboxylic acid, polyallylcarboxylic acid, polyacrylcarboxylic acid, polymethacrylcarboxylic acid, poly-2-acrylamide-2-methylpropanecarboxylic acid, polyisoprenecarboxylic acid and polyacrylic acid. The polyanion may be a homopolymer of any of these or a copolymer composed of two or more types of these.

The polyanion may further contain F (fluorine atom) in the compound. Specific examples thereof include Nafion (produced by DuPont K.K.) containing a perfluorosulfonic acid group and Flemion (produced by Asahi Glass Co., Ltd.) composed of perfluorovinyl ether containing a carboxylic acid group. These fluorinated polyanions are each used in combination with any of the above non-fluorinated polyanions, thereby forming a transparent electrode provided with a positive hole injection function, which is desired in terms of element efficiency and productivity.

Degree of polymerization of the polyanion is preferably in a range from 10 to 100,000 in the number of monomer units and, in terms of dissolubility in a solvent and conductivity, far preferably in a range from 50 to 10,000 in the number of monomer units.

A method for producing the polyanion is exemplified by: a method of, using acid, direct introduction of an anionic group into a polymer having no anionic group; a method of, using a sulfonating agent, sulfonation of a polymer having no anionic group; and a method of polymerization of an anionic group-containing polymerizable monomer(s).

The method of polymerization of the anionic group-containing polymerizable monomer is exemplified by a method of subjecting, in a solvent, anionic group-containing polymerizable monomers to oxidative polymerization or radical polymerization under the presence of an oxidizer and/or a polymerization catalyst. More specifically, a predetermined amount of anionic group-containing polymerizable monomers is dissolved into a solvent, the resulting product is kept at a constant temperature, and a solution in which a predetermined amount of an oxidizer and/or a polymerization catalyst is dissolved into a solvent in advance is added thereto and reacts therewith for a predetermined time. The polymer produced by the reaction is adjusted to be a certain concentration using a solvent. In this production method, the anionic group-containing polymerizable monomer may be copolymerized with a polymerizable monomer(s) containing no anionic group.

The oxidizer, oxidization catalyst and solvent used in polymerization of the anionic group-containing polymerizable monomer are the same as those used in polymerization of the precursor monomer for forming the π-conjugated conductive polymer.

When the produced polymer is polyanionic salt, it is preferable to denature polyanionic salt to polyanionic acid. A method for denaturing polyanionic salt to polyanionic acid is exemplified by: ion exchange using ion exchange resin; dialysis; and ultrafiltration. Of these, ultrafiltration is preferable in terms of easiness in work.

A ratio of the π-conjugated conductive polymer to the polyanion contained in the conductive polymer, namely, "π-conjugated conductive polymer":"polyanion", in mass ratio is preferably in a range from 1:1 to 1:20 and, in terms of conductivity and dispersibility, far preferably in a range from 1:2 to 1:10.

The oxidizer, which is used in subjecting the precursor monomer for forming the π-conjugated conductive polymer to chemical oxidative polymerization under the presence of the polyanion so as to produce the conductive polymer of the present invention, is any of oxidizers which are suitable for oxidative polymerization of pyrrole and mentioned in J. Am. Soc., Vol. 85, p. 454 (1963), for example. For practical reasons, it is preferable to use an inexpensive and easily handleable oxidizer, and examples thereof include: iron (III) salts, such as $FeCl_3$, $Fe(ClO_4)_3$, and iron (III) salt of organic acid or inorganic acid containing organic residue; hydrogen peroxide; potassium dichromate; alkali persulfate (potassium persulfate, sodium persulfate, etc.); ammonium; alkali perborate; potassium permanganate; and copper salt, such as copper tetrafluoroborate. In addition, air and oxygen under the presence of a catalytic amount of metal ion, such as iron ion, cobalt ion, nickel ion, molybdenum ion or vanadium ion, can be used as the oxidizer as needed. Using persulfate or iron (III) salt of organic acid or inorganic acid containing organic residue has a great practical advantage because of its non-corrosiveness.

Examples of the iron (III) salt of inorganic acid containing organic residue include iron (III) salts, namely, Fe (III) salts, of: alkanol sulfuric acid half-ester having 1 to 20 carbon atoms, such as lauryl sulfate; alkylsulfonic acid having 1 to 20 carbon atoms, such as methane- or dodecane-sulfonic acid; aliphatic carboxylic acid having 1 to 20 carbon atoms, such as 2-ethylhexylcarboxylic acid; aliphatic perfluorocarboxylic acid, such as trifluoroacetic acid and perfluorooctanoic acid; aliphatic dicarboxylic acid, such as oxalic acid; and in particular, optionally-alkyl-substituted aromatic sulfonic acid having 1 to 20 carbon atoms, such as benzenesulfonic acid, p-toluenesulfonic acid and dodecylbenzene sulfonic acid.

For this sort of conductive polymer, a commercially-available material can also be preferably used.

For example, a conductive polymer (abbreviated as PEDOT-PSS) composed of poly(3,4-ethylene dioxythiophene) and polystyrenesulfonic acid is commercially available from H.C. Starck GmbH as Clevios Series, from Aldrich as PEDOT-PSS 483095 and 560596, and from Nagase ChemteX Corporation as Denatron Series. In addition, polyaniline is commercially available from Nissan Chemical Industries, Ltd. as ORMECON Series. Any of these materials can also be preferably used in the present invention.

(2) Nonconductive Polymer
(2.1) Self-Dispersing Nonconductive Polymer

The self-dispersing nonconductive polymer of the present invention is a self-dispersing polymer being dispersible in an aqueous solvent, containing a dissociable group and having a glass transition temperature of 25° C. or more and 150° C. or less.

The dissociable group-containing self-dispersing polymer dispersible in an aqueous solvent does not contain a surfactant, an emulsifier and so forth which assist micelle formation, but is dispersible by itself in an aqueous solvent. The "dispersible in an aqueous solvent" means that colloidal particles composed of binder resin are dispersed in an aqueous solvent without being aggregated.

The size of colloidal particles is around 0.001 to 1 μm (1 to 1000 nm) in general. The size of colloidal particles is preferably 3 to 500 nm, far preferably 5 to 300 nm and still far preferably 10 to 100 nm. With respect to the above colloidal particles, measurement thereof can be carried out with a light scattering photometer.

The "aqueous solvent" means not only pure water (distilled water and deionized water included) but also an aqueous solution containing acid, alkali, salt or the like; a water-containing organic solvent; and a hydrophilic organic solvent. Examples thereof include pure water (distilled water and deionized water included); alcoholic solvents such as methanol and ethanol; and a mixed solvent of water and alcohol.

The dissociable group-containing self-dispersing polymer of the present invention is preferably transparent.

The dissociable group-containing self-dispersing polymer is not particularly limited as long as it is a medium which forms a film. Although not particularly limited as long as it does not bleed out to the transparent electrode surface and does not cause any problems in performance of organic EL elements when the elements are stacked, the polymer dispersion preferably does not contain, for example, a surfactant (emulsifier) or a plasticizer which controls a film forming temperature.

pH of the dissociable group-containing self-dispersing polymer dispersion used for producing a transparent electrode is desired to be in a range in which the dispersion does not separate from the conductive polymer solution, which is mixed with the dispersion later, preferably in a range from 0.1 to 11.0 and far preferably in a range from 3.0 to 9.0.

The glass transition temperature (Tg) of the dissociable group-containing self-dispersing polymer of the present invention is 25° C. or more and 150° C. or less, preferably 30° C. to 110° C.

The glass transition temperature being 25° C. or more not only improves a film forming property of the coating film and surface smoothness of the transparent electrode but also prevents deformation of the coating film and degradation of performance of the organic EL element under an environmental test of the transparent electrode and the organic EL element carried out at a high temperature. Further, the glass transition temperature being 150° C. or less improves homogeneity and surface smoothness of the conductive polymer layer, which is composed of the conductive polymer and the self-dispersing polymer, and improves performance of the element.

The glass transition temperature is measured at a temperature rise rate of 10° C./min with a differential scanning calorimeter (Model DSC-7 produced by PerkinElmer Inc.) in conformity with JIS K7121 (1987).

Examples of the dissociable group used for the dissociable group-containing self-dispersing polymer include anionic groups (sulfonic acid and salt thereof, carboxylic acid and salt thereof, phosphoric acid and salt thereof, etc.) and cationic groups (ammonium salt, etc.). Although not particularly limited, the dissociable group is preferably an anionic group in terms of compatibility with the conductive polymer solution.

The amount of the dissociable group may be any as long as the self-dispersing polymer is dispersible in an aqueous solvent, preferably an amount as small as possible in terms of process adequacy so that a drying load is reduced. A counter species used for an anionic group or a cationic group is not particularly limited, but it is preferably hydrophobic and exists at a small amount in terms of performance of transparent electrodes and/or organic EL elements when the transparent electrodes and/or the organic EL elements are stacked.

Examples of the principal skeleton of the dissociable group-containing self-dispersing polymer include polyethylene, polyethylene-polyvinyl alcohol (PVA), polyethylene-polyvinyl acetate, polyethylene-polyurethane, polybutadiene, polybutadiene-polystyrene, polyamide (nylon), polyvinylidene chloride, polyester, polyacrylate, polyacrylate-polyester, polyacrylate-polystyrene, polyvinyl acetate, polyurethane-polycarbonate, polyurethane-polyether, polyurethane-polyester, polyurethane-polyacrylate, silicone, silicone-polyurethane, silicone-polyacrylate, polyvinylidene fluoride-polyacrylate and polyfluoroolefin-polyvinyl ether. Copolymers each composed of any of these skeletons as a base and another monomer may also be used. Of these, polyester resin emulsion and polyester-acrylic resin emulsion each having the ester skeleton, acrylic resin emulsion having the acrylic skeleton, and polyethylene resin emulsion having the ethylene skeleton are preferable.

Commercially-available products usable include: Yodosol AD-176 and AD-137 (acrylic resin, produced by Henkel Japan Ltd.); Vylonal MD-1200, MD-1245 and MD-1500 (polyester resin, produced by Toyobo Co., Ltd.); and PLAS COAT RZ570, PLAS COAT Z561, PLAS COAT 2565, PLAS COAT 2687 and PLAS COAT 2690 (polyester resin, produced by Goo Chemical Co., Ltd.). The dispersions of the above dissociable group-containing self-dispersing polymers each dispersible in an aqueous solvent can be used individually or in combination.

The used amount of the dissociable group-containing self-dispersing polymer is, to the conductive polymer, preferably 50 to 1,000 percent by mass, far preferably 100 to 900 percent by mass and still far preferably 200 to 800 percent by mass.

(2.2) Hydroxy Group-Containing Polymer

The hydroxy group-containing polymer is a polymer composed of the structural unit (I) having a hydroxy group.

[Chem. 2]

(I)

In the structural unit (I), R represents a hydrogen atom or a methyl group; Q represents —C(=O)O— or —C(=O)NRa—, where Ra represents a hydrogen atom or an alkyl group; and A represents a substituted or non-substituted alkylene group or —(CH$_2$CHRbO)x-(CH$_2$CHRb)—, where Rb represents a hydrogen atom or an alkyl group, and x represents a number of 0 to 100 as an average number of repeating units.

Representative examples of the structural unit represented by the general formula (I) are shown below. However, the present invention is not limited thereto.

[Chem. 3]

I-1

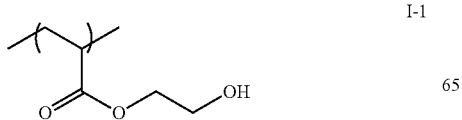

I-2

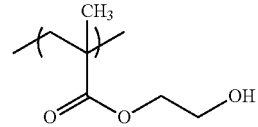

I-3

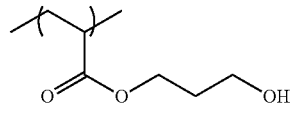

I-4

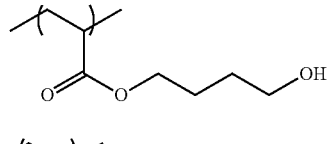

I-5

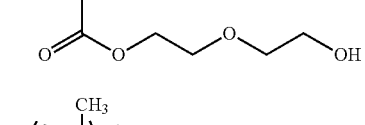

I-6

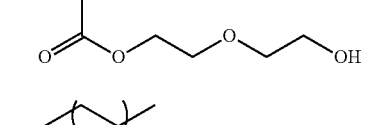

I-7

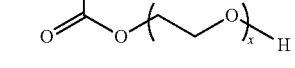

x = 4.5

I-8

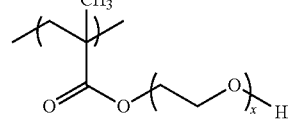

x = 4.5

I-9

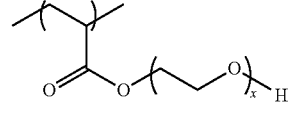

x = 10

I-10

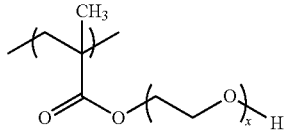

x = 8

I-11

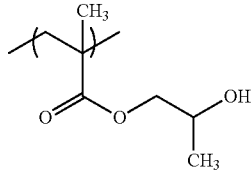

I-12 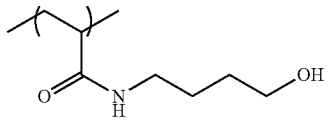

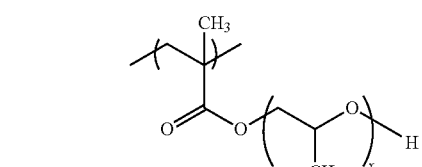

x = 9

I-13

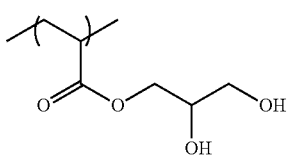

I-14

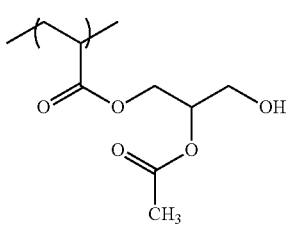

I-15

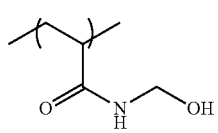

I-16

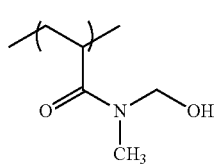

I-17

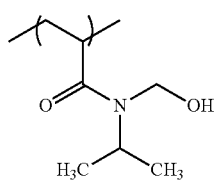

I-18

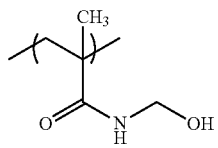

I-19

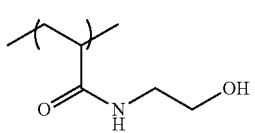

I-20

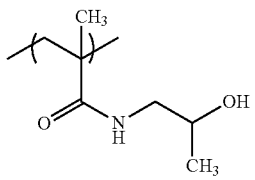

I-21

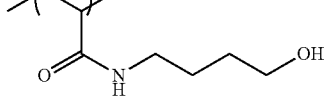

A ratio of the hydroxy group-containing polymer to the conductive polymer of the conductive polymer layer is, to 100 parts by mass of the conductive polymer, preferably 30 parts by mass to 900 parts by mass of the hydroxy group-containing polymer and, in terms of current leakage prevention and transparency, far preferably 100 parts by mass or more of the hydroxy group-containing polymer.

(3) Polar Solvent

The composition for forming the conductive polymer layer contains the dissociable group-containing self-dispersing polymer, and, by also containing a polar solvent, keeps itself stable without reducing dispersion stability of the dissociable group-containing self-dispersing polymer and can be stably discharged when being applied by the inkjet method.

The polar solvent usable has a dielectric constant of 25 or more, preferably 30 or more and far preferably 40 or more. Examples thereof include ethylene glycol, diethylene glycol, triethylene glycol, propylene glycol, dipropylene glycol, butanediol, pentanediol, glycerin, dimethylformamide, dimethylacetamide, N-methylpyrrolidone and dimethyl sulfoxide. In particular, propylene glycol and ethylene glycol are preferable in terms of a drying/removal property with infrared rays, stability of the composition, a discharge property thereof by inkjet printing, conductivity of the conductive polymer layer and so forth.

The added amount of the polar solvent can be determined in terms of stability of the composition and is, to the total weight of the composition, preferably 5% or more and 40% or less. When the added amount is 5% or more, the stabilization effect of the composition is improved, whereas when the added amount is 40% or less, surface tension of the composition is not too high and wettability thereof to a substrate is improved.

The dielectric constant of the solvent is measurable, for example, with a liquid dielectric constant meter Model 871 (produced by Nihon Rufuto Co., Ltd.).

(4) Glycol Ether

The composition for forming the conductive polymer layer preferably contains glycol ether. This can effectively reduce surface tension of the composition containing the conductive polymer without reducing dispersion stability thereof, achieve necessary and sufficient wettability thereof on a substrate and also achieve a stable discharge property of the composition being applied by the inkjet method.

In terms of these, glycol ether is preferably water-soluble and has a surface tension of preferably 40 mN/m or less, far preferably 35 mN/m or less and particularly preferably 30 mN/m or less.

The added amount of the glycol ether can be determined on the basis of the surface tension of the composition and is, to the total weight of the composition, preferably 5% or more and 30% or less. When the added amount is 5% or more, the surface tension reducing effect is obtained and wettability of the composition to the substrate is improved, whereas when the added amount is 30% or less, dispersion stability of the composition and application uniformity thereof by inkjet printing are improved.

Examples of the glycol ether include ethylene glycol alkyl ether, diethylene glycol alkyl ether, triethylene glycol alkyl ether, propylene glycol alkyl ether, dipropylene glycol alkyl ether and tripropylene glycol alkyl ether. In terms of viscosity, surface tension and dispersion stability of the composition, ethylene glycol monoalkyl ether and propylene glycol monoalkyl ether are preferable.

Examples of the ethylene glycol monoalkyl ether and the propylene glycol monoalkyl ether include ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether and propylene glycol monobutyl ether. In particular, ethylene glycol monobutyl ether and propylene glycol monopropyl ether are preferable.

<<Properties of Transparent Electrode>>

A transparent electrode has a total luminous transmittance of preferably 60% or more, far preferably 70% or more and particularly preferably 80% or more. The total luminous transmittance is measurable, for example, with a spectrophotometer by a publicly-known method.

The electric resistance of the transparent electrode of the present invention is, in surface resistivity, preferably 1,000Ω/□ or less and far preferably 100Ω/□ or less. In order to apply the transparent electrode to a current-driven optoelectronic device, the electric resistance thereof is preferably 50Ω/□ or less and particularly preferably 10Ω/□ or less.

The surface resistivity is measurable, for example, in conformity with JIS K 7194:1994 (Testing Method for Resistivity of Conductive Plastics with a Four-Point Probe Array) and is simply and easily measurable with a commercially-available surface resistivity meter.

The thickness of the transparent electrode of the present invention is not particularly limited and is appropriately selectable depending on its purpose, but preferably 10 µm or less in general. The thinner it is, the higher the transparency and flexibility are, and therefore the thinner the better.

<<Method for Producing Transparent Electrode>>

A method for producing the transparent electrode basically includes:

(i) a step of forming a conductive metal layer on a transparent resin substrate;

(ii) a step of applying a composition containing a conductive polymer and a nonconductive polymer over the transparent resin substrate and the conductive metal layer so as to form a conductive polymer layer; and (iii) a step of irradiating the conductive polymer layer with infrared rays.

The steps (i) and (ii) are detailed above.

The step (iii) is detailed below.

<<Irradiation with Infrared Rays>>

At the step of irradiating the conductive polymer layer with infrared rays, the irradiation is carried out with infrared rays having a ratio of the spectral radiance at a wavelength of 5.8 µm to the spectral radiance at a wavelength of 3.0 µm of 5% or less.

In general, the "infrared rays" indicate luminous radiation having a wavelength longer than that of visible radiation.

In the infrared rays of the embodiment, the ratio of the spectral radiance at a wavelength of 5.8 µm to the spectral radiance at a wavelength of 3.0 µm is 5% or less, preferably 3% or less, far preferably 1% or less and most preferably 0.5% or less.

The aqueous solvent preferably used for the liquid composition for forming the conductive polymer layer has a strong absorption wavelength owing to OH stretching vibration at around 3.0 µm.

On the other hand, the polyester resin film preferably used for the transparent resin substrate has almost no absorption wavelength at around 3.0 µm of the infrared wavelength region, but has a strong absorption wavelength at 5.8 µm or more of the infrared wavelength region.

Then, in the embodiment, the irradiation is carried out with the infrared rays, which dries the conductive polymer layer without damaging the transparent resin substrate and improves thickness uniformity, surface smoothness and patterning accuracy of the conductive polymer layer. Then, the transparent electrode produced by the production method is used in an organic EL element, which can produce effects of reduction in driving voltage, reduction in emission unevenness and increase in lifetime of the organic EL element.

A method for the irradiation with the infrared rays is not particularly limited, but it is preferable to use an infrared heater. As the infrared heater, for example, an infrared heater described in Japanese Patent No. 4790092 can be preferably used.

Hereinafter, an infrared heater preferably used in the present invention is described.

<<Infrared Heater>>

An infrared heater 20 is columnar in its external appearance and, as shown in FIG. 3, has a structure mainly composed of a filament 22, a protective tube 24, a filter 26 and a filter 28 being arranged in this order to be concentric circles. The filters 26 and 28 have a function to absorb infrared rays having a wavelength of 3.5 µm or more. Examples of the material for the filters 26 and 28 include quartz glass and borosilicate crown glass. In terms of heat resistance and thermal shock resistance, quartz glass is preferable.

The infrared heater (20) has the function to absorb infrared rays having a wavelength of 3.5 µm or more. Details are as follows. The filters 26 and 28 themselves absorb the infrared rays having a wavelength of 3.5 µm or more and hence are heated by the filament 22 and accordingly reach a high temperature, whereby the filters 26 and 28 themselves become infrared emitters and emit infrared rays having a long wavelength. However, in the infrared heater 20, a coolant (e.g., cooling air) circulates in a hollow part 30 between the filters 26 and 28, and this cooling system can decrease the surface temperature(s) of the filters 26 and 28 and reduce the secondary radiation emitted by the filters 26 and 28. Consequently, infrared radiation of a wavelength of 3.5 µm or more decrease, in particular, far-infrared radiation of a wavelength of 5.8 µm or more, for which the transparent resin substrate 2 has the absorption region, can greatly decrease. Then, the drying target is selectively irradiated with infrared rays having a wavelength of 3.0 µm, for which the aqueous solvent has the absorption region. Consequently, the conductive polymer layer can be dried without the transparent resin substrate 2 being deformed.

The thickness and the number of the filters 26 and 28 can be appropriately selected/changed according to the necessary infrared spectrum.

As the cooling system, as described above, two or more filters are stacked to be hollow therebetween, and the air is sent to the hollow part between the filters, whereby cooling can be carried out.

Regarding the shape (s) of the filters, as described above, the filters 26 and 28 may be concentric circular to cover the entire columnar filament 22, or as shown in FIG. 4, a reflective plate 32 may cover three directions of the filament 22 (and the protective tube 24) and the filters 26 and 28 may be arranged to be parallel plates on the side from which infrared rays are emitted.

In the case where another filter(s) is arranged in addition to the filters 26 and 28, thereby forming a multiple structure, it is preferable that the air for cooling be made to flow in opposite directions in the hollow parts between the filters in terms of cooling efficiency. Further, the air for cooling on the exhaust side may be exhausted to the outside of the system, or may be utilized as a part of hot air used at the drying step.

The temperature of the filament 22 of the infrared heater 20 is preferably 800° C. or more in order to achieve both the drying property of the conductive polymer layer and prevention of deformation of the transparent resin substrate and preferably 3,000° C. or less in terms of the heat resistance of the filament 22.

According to the embodiment, radiation energy of the wavelength region corresponding to the absorption of the aqueous solvent can be increased according to the filament temperature.

The filament temperature can be appropriately selected/changed according to desired application and drying conditions. The filament temperature is measurable, for example, with a radiation thermometer.

The surface temperature of the outermost filter (filter 28 in the cases of FIG. 3 and FIG. 4) arranged on the side where the drying target exists is preferably 200° C. or less and far preferably 150° C. or less in order to prevent the secondary radiation emitted by the filter itself absorbing infrared rays. The surface temperature of the outermost filter is adjustable by sending the air to between two or more filters stacked.

As shown in FIG. 3 and FIG. 4, the infrared heater 20 is connected to a cooling mechanism 40 to make a coolant flow (to circulate a coolant) in the hollow part 30, and the cooling mechanism 40 and the filament 22 are connected to a control device 50. In the control circuit, the control device 50 controls the amount of the coolant sent to the hollow part 30 by the cooling mechanism 40, the heating temperature of the filament 22, and so forth.

Additionally, preheating may be carried out before the step of irradiation with infrared rays to the extent of no deformation of the transparent resin substrate.

A method for the preheating includes but is not limited to: treatments with: electronic furnaces such as a hot plate, a box furnace and a conveyor furnace; a near-infrared heater; a mid-infrared heater; a far-infrared heater; warm air; hot air; and microwaves. These may be used individually or in combination.

At the step of irradiation with infrared rays, the drying zone may be constituted of (covered with) a material having a high infrared reflectivity, whereby the infrared rays not absorbed by the drying target can be utilized at a high efficiency.

The ratio of the spectral radiance at a wavelength of 5.8 μm to the spectral radiance at a wavelength of 3.0 μm of the infrared rays of the embodiment can be obtained, for example, in the following way.

First, with reference to a method described, for example, in Non-Patent Document 1 (Research Report of Method for Simply Evaluating Radiation Energy from Far Infrared Heater, The 2005 Fiscal Year (by The Japan Machinery Federation and Japan Far Infrared Rays Association)) or Non-Patent Document 2 (FTIR TALK LETTER Vol. 13 (by Shimadzu Corporation)), radiation output from the infrared heater and radiation output from the standard black body furnace the temperature of which is adjusted to be the same as the filament temperature of the infrared heater are measured with FT-IR (Fourier transform infrared spectrophotometer), whereby the spectral emissivity of the infrared heater is obtained.

Next, the black body radiation spectrum calculated in accordance with Planck's law is multiplied by the spectral emissivity of the infrared heater, whereby the spectrum of the infrared heater is obtained. From the obtained spectrum, a value of the spectral radiance at a wavelength of 3.0 μm and a value of the spectral radiance at a wavelength of 5.8 μm are read, and a ratio of the spectral radiance at a wavelength of 5.8 μm to the spectral radiance at a wavelength of 3.0 μm is calculated in percentage and accordingly obtained.

<<Organic Electronic Element>>

An organic electronic element is basically composed of a first electrode, a second electrode and an organic functional layer and has a structure in which the second electrode is arranged to face the first electrode, and the organic functional layer is arranged between the first electrode and the second electrode.

As the organic electronic element, for example, an organic EL element or an organic thin-film solar cell element is used, in which the above-described transparent electrode is used, particularly as the first electrode.

For example, in an organic EL element, the transparent electrode of the present invention is preferably used as the anode, and as the organic functional layer (organic luminescent layer, etc.) and the second electrode (cathode), ones each having a material, a structure and so forth generally used in an organic EL element can be appropriately used.

There are various examples of the structure of the organic EL element, including anode/organic luminescent layer/cathode, anode/hole transport layer/organic luminescent layer/electron transport layer/cathode, anode/hole injection layer/hole transport layer/organic luminescent layer/electron transport layer/cathode, anode/hole injection layer/organic luminescent layer/electron transport layer/electron injection layer/cathode, and anode/hole injection layer/organic luminescent layer/electron injection layer/cathode.

Examples of a luminescent material and a dopant material usable for the organic luminescent layer include but are not limited to anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, quinoline metal complex, tris(8-hydroxyquinolinate) aluminum complex, tris(4-methyl-8-quinolinate) aluminum complex, tris(5-phenyl-8-quinolinate) aluminum complex, aminoquinoline metal complex, benzoquinoline metal complex, tri-(p-terphenyl-4-yl)amine, 1-aryl-2,5-di(2-thienyl)pyrrole derivative, pyran, quinacridone, rubrene, distylbenzene derivative, distylarylene derivative, and various fluorescent dyes, rare earth metal complexes and phosphorescent materials. The organic luminescent layer preferably contains 90 to 99.5 parts by mass of a luminescent material and 0.5 to 10 parts by mass of a dopant material selected from these compounds.

The organic luminescent layer is formed of any of the above materials and so forth by a publicly-known method, and examples thereof include vapor deposition, application and transfer. The thickness of the organic luminescent layer is preferably 0.5 to 500 nm and particularly preferably 0.5 to 200 nm.

The organic EL element of the present invention is usable for a self-emitting display, a back light for a liquid crystal device, an illumination device and so forth. The organic EL element of the present invention is preferably used for illumination purposes because it can uniformly emit light with no unevenness.

The transparent electrode of the present invention has both high conductivity and high transparency and is suitably usable in the fields of: various optoelectronic devices, such as liquid crystal display elements, organic luminescent elements, inorganic electroluminescent elements, electronic paper, organic solar cells and inorganic solar cells; electromagnetic shields; and touch panels. Of these, it can be particularly preferably used as a transparent electrode of an organic EL element or an organic thin-film solar cell element strictly demanded to have surface smoothness of the transparent electrode.

<<Structure and Production Method of Organic EL Element (60)>>

As shown in FIG. 5, an organic EL element 60 has a transparent electrode 1 composed of a transparent resin substrate 2, a conductive metal layer 4 and a conductive polymer layer 6.

On the side edge parts of the transparent resin substrate 2 of the transparent electrode 1, extraction electrodes 62 are formed.

The extraction electrodes 62 are in contact with the conductive metal layer 4 and the conductive polymer layer 6 and electrically conductive with these members. On the conductive polymer layer 6 of the transparent electrode 1, an organic functional layer 64 is formed. The organic functional layer 64 is composed of a positive hole transport layer, a luminescent layer, a positive hole block layer, an electron transport layer and so forth. On the organic functional layer 64, a counter electrode 66 is formed. The counter electrode 66 is an electrode facing the transparent electrode 1 and having a polarity opposite to that of the transparent electrode 1.

The organic EL element 60 is sealed by a sealing member 68 with parts of the extraction electrodes 62 exposed, so that the transparent electrode 1 and the organic functional layer 64 are covered with and protected by the sealing member 68.

Next, a method for producing an organic EL element 60 of the present invention is described with reference to FIGS. 6A to 6F.

Figure 6A:
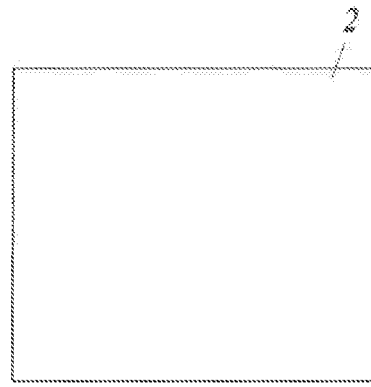
FIG. 6A is a schematic plan view for sequentially explaining a method for producing an organic EL element.
Figure 6B:
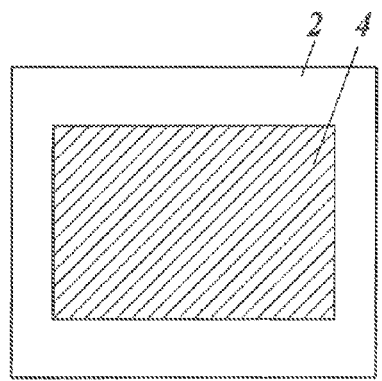
FIG. 6B is a schematic plan view for sequentially explaining the method for producing an organic EL element.

First, on a transparent resin substrate 2 (FIG. 6A), a conductive metal layer 4 is formed by patterning (FIG. 6B).

Figure 6C:
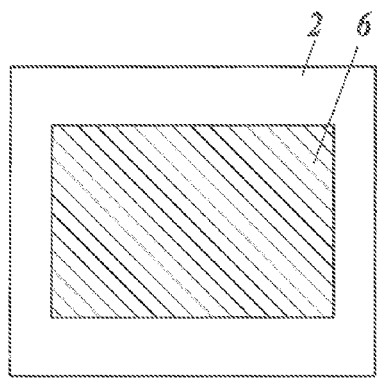
FIG. 6C is a schematic plan view for sequentially explaining the method for producing an organic EL element.

Then, a certain composition composed of a conductive polymer, a nonconductive polymer and so forth is prepared, the composition is inkjet-printed on the conductive metal layer 4 and dried by being irradiated with infrared rays, thereby forming a conductive polymer layer 6, and the conductive metal layer 4 is covered with the conductive polymer layer 6 (FIG. 6C).

Figure 6D:
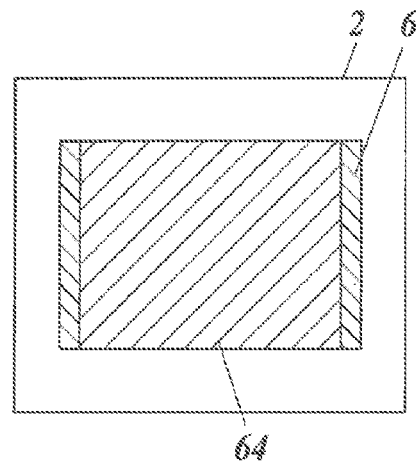
FIG. 6D is a schematic plan view for sequentially explaining the method for producing an organic EL element.
Figure 6E:
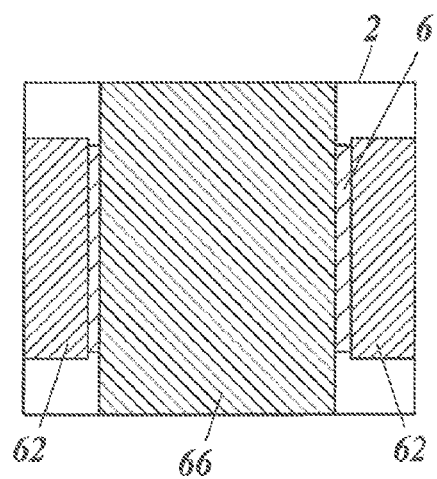
FIG. 6E is a schematic plan view for sequentially explaining the method for producing an organic EL element.

Then, on the conductive polymer layer 6 (transparent electrode 1), an organic functional layer 64 composed of a positive hole transport layer, a luminescent layer, a positive hole block layer, an electron transport layer and so forth is formed (FIG. 6D).

Figure 6F:
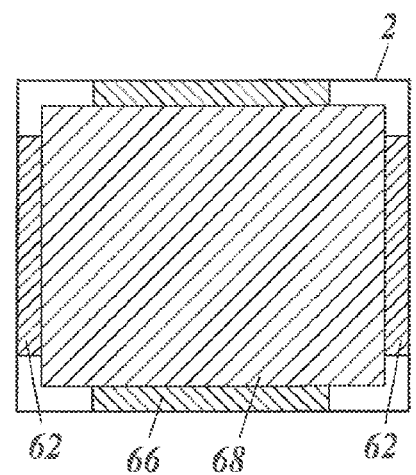
FIG. 6F is a schematic plan view for sequentially explaining the method for producing an organic EL element.

Then, extraction electrodes 62 and a counter electrode 66 which is formed in such a way as to cover the organic functional layer 64 are formed (FIG. 6E), and the transparent electrode 1 and the organic functional layer 64 are sealed by a sealing member 68 in such a way that the transparent electrode 1 and the entire organic functional layer 64 are covered with the sealing member 68 (FIG. 6F).

Through these steps, an organic EL element 60 is produced.

Hereinafter, the present invention is more specifically described with Examples. However, the present invention is not limited thereto. Note that "parts" and "%" used in Examples stand for "parts by mass" and "percent by mass (mass %)", respectively, unless otherwise specified.

FIRST EXAMPLE (1) Production of Transparent Resin Substrate
(1.1) Formation of Smooth Layer To a no-undercoated side of a 100 μm thick polyethylene terephthalate film (Cosmoshine A4100 produced by Toyobo Co., Ltd.), a UV curable organic/inorganic hybrid hard coat material OPSTAR 27501 produced by JSR Corporation was (i) applied with a wire bar in such a way that the average thickness after application and drying thereof was 4 μm, (ii) dried at 80° C. for three minutes, and then (iii) cured at 1.0 J/cm$^2$ as a curing condition under the air atmosphere with a high-pressure mercury lamp. Thus, a smooth layer was formed.

(1.2) Formation of Gas Barrier Layer

Next, on the sample substrate provided with the smooth layer, a gas barrier layer was formed under the conditions below.

(1.2.1) Application of Gas Barrier Layer Application Liquid

A 20 mass % dibutyl ether solution of perhydropolysilazane (PHPS, Aquamica NN320 produced by AZ Electronic Materials) was applied with a wire bar in such a way that the (average) thickness after drying thereof was 0.30 μm, thereby producing an applied sample.

(1.2.2) Dry Treatment and Dehumidification Treatment

<First Step; Dry Treatment>

The produced applied sample was treated under the atmosphere where the temperature was 85° C. and the humidity was 55% RH for one minute, thereby producing a dried sample.

<Second Step; Dehumidification Treatment>

The dried sample was kept under the atmosphere where the temperature was 25° C. and the humidity was 10% RH (dew-point temperature of −8° C.) for 10 minutes as dehumidification treatment.

(1.2.3) Modification Treatment

The dehumidified sample was modified under the conditions below with the device below. Thus, the gas barrier layer was formed. The dew-point temperature at the modification treatment was −8° C.

<Modification Device>

Excimer irradiation unit Model MECL-M-1-200 produced by M.D.COM., Inc., wavelength of 172 nm, lamp filled gas of Xe <Modification Conditions>

Excimer laser intensity: 60 mW/cm$^2$ (172 nm)
Distance between sample and light source: 1 mm
Stage heating temperature: 70° C.
Oxygen concentration in irradiation unit: 1%
Excimer laser irradiation time: 3 seconds Thus, a film substrate (transparent resin substrate) for a transparent electrode having a gas barrier property was produced.

(2) Formation of Conductive Metal Layer

A conductive metal layer was formed on a barrier side of the produced film substrate for a transparent electrode having a gas barrier property by the method described below.

A silver nano-ink (TEC-PR-030 produced by InkTec Co., Ltd.) was printed on the film substrate using a gravure proofer K303 Multicoater (produced by RK Print Coat Instruments, Ltd.) in a mesh pattern having a wire width of 50 µm and a wire interval of 1 mm. Thus, the conductive metal layer having a thin metal wire pattern was formed. (See FIG. 6B.) This was heated at 120° C. for 30 minutes.

The pattern of the conductive metal layer was measured with a high-luminance noncontact three-dimensional surface roughness meter Wyko NT9100 (produced by Nihon Veeco K.K.). The wire width of the pattern was 60 µm, and the average wire height thereof was 500 nm.

(3) Formation of Conductive Polymer Layer (3.1) Synthesis of Hydroxy Group-Containing Polymer (3.1.1) Synthesis of Initiator 1: Methoxy-Caped Oligo-ethyleneglycol Methacrylate In a 50 ml three-neck flask, 2-bromoisobutyryl bromide (7.3 g, 35 mmol), triethylamine (2.48 g, 35 mmol) and THF (20 ml) were poured, and the internal temperature was kept at 0° C. with a water bath. Into this solution, 30 ml of a 33% THF solution of oligoethyleneglycol (10 g, 23 mmol, ethyleneglycol units of 7 to 8, produced by Laporte Specialties) was dripped. After being stirred for 30 minutes, the solution was made to room temperature and stirred for another four hours. The THF was removed under the reduced pressure with a rotary evaporator, the residue was dissolved into diethyl ether, and the resulting product was transferred to a separatory funnel. After the ether layer was cleaned three times with added water, the ether layer was dried with $MgSO_4$. The ether was distilled under the reduced pressure with the rotary evaporator. Thus, 8.2 g (yield of 73%) of the initiator 1 was produced.

(3.1.2) Synthesis of Hydroxy Group-Containing Polymer by Living Polymerization (ATRP)

The initiator 1 (500 mg, 1.02 mmol), 2-hydroxyethyl acrylate (4.64 g, 40 mmol, produced by Tokyo Chemical Industry Co., Ltd.) and 5 ml of a 50:50 v/v % methanol/water mixed solvent were poured into a Schlenk flask, and the Schlenk flask was immersed in liquid nitrogen for 10 minutes under the reduced pressure. The Schlenk flask was took out from the liquid nitrogen, and five minutes later, nitrogen substitution was carried out. After this process was carried out three times, under nitrogen, bipyridine (400 mg, 2.56 mmol) and CuBr (147 mg, 1.02 mmol) were added and stirred at 20° C. 30 minutes later, the reaction solution was dripped onto a 4 cm Hirsch funnel with filter paper and silica placed thereon, and the reaction solution was collected under the reduced pressure. The solvent was distilled under the reduced pressure with the rotary evaporator and then dried at 50° C. for three hours under the reduced pressure. Consequently, as a hydroxy group-containing polymer having a number average molecular weight of 13,100, a molecular weight distribution of 1.17 and a content of the number average molecular weight<1,000 of 0%, 2.60 g (yield of 84%) of poly(2-hydroxyethyl acrylate) was produced. The structure and molecular weight were measured with 1H-NMR (400 MHz, produced by JEOL Ltd.) and GPC (Waters 2695, produced by Waters Corporation), respectively. The produced polymer was diluted with water so as to be adjusted to be a 20% liquid (hereinafter, abbreviated to PHEA).

<GPC Measurement Conditions>
  Device: Wagers 2695 (Separations Module)
  Detector: Waters 2414 (Refractive Index Detector)
  Column: Shodex Asahipak GF-7M HQ
  Eluent: dimethylformamide (20 mM LiBr)
  Flow velocity: 1.0 ml/min
  Temperature: 40° C.

(3.2) Preparation of Composition for Forming Conductive Polymer Layer

A transparent conductive polymer Clevios PH510 (1.89% liquid, produced by Heraeus Holding) and each nonconductive polymer shown in TABLE 1 and TABLE 2 were mixed at a solid content ratio of 15:85, 70 parts by mass of this mixture was mixed with 15 parts by mass of a polar solvent (Solvent-1 in TABLE 1 and TABLE 2) and 12 parts by mass of glycol ether (Solvent-2 in TABLE 1 and TABLE 2), and then water was added thereto to reach 100 parts by mass. Thus, each composition for forming a conductive polymer layer was prepared.

Abbreviations of the nonconductive polymers, solvents-1 and solvents-2 in TABLE 1 and TABLE 2 stand for those below.

Z-561: self-dispersing polymer PLAS COAT Z-561 (25% liquid, produced by Goo Chemical Co., Ltd.)

Z-690: self-dispersing polymer PLAS COAT Z-690 (25% liquid, produced by Goo Chemical Co., Ltd.)

PHEA: poly(2-hydroxyethyl acrylate)

EG: ethylene glycol

PG: propylene glycol

DMSO: dimethyl sulfoxide

EGBu: ethylene glycol monobutyl ether

PGPr: propylene glycol monopropyl ether (3.3) Application Treatment and Dry Treatment Over the film substrate for a transparent electrode having a gas barrier property and the formed conductive metal layer, each composition for forming a conductive polymer layer described above was applied by inkjet printing. (See FIG. 6C.)

Each composition was dried under the drying conditions shown in TABLE 1 and TABLE 2 so as to form each conductive polymer layer. Thus, transparent electrode samples 101 to 142, each having the conductive metal layer and the conductive polymer layer, were formed.

The inkjet printing was carried out using a desktop-type robot Shotmaster-300 (produced by Musashi Engineering, Inc.) provided with an inkjet head (produced by Konica Minolta IJ Technologies, Inc.) and was controlled by an inkjet evaluation system EB150 (produced by Konica Minolta IJ Technologies, Inc.).

The drying methods in TABLE 1 and TABLE 2 are as follows.

HP: conductive heat transfer drying with hot plate (MH-180CS, produced by AS ONE Corporation)

IR-1: radiation heat transfer drying with infrared heater (1000 W/color temperature 2500 K, produced by USHIO Inc.)

IR-2: radiation heat transfer drying with infrared heater (the above IR irradiation device IR-1 provided with an air-cooling mechanism in a quartz glass duplex tube referring to Japanese Patent No. 4790092, see FIG. 3)

In IR-1 and IR-2, the distance (interval) between the infrared heater and the sample(s) was kept at 100 mm.

The "HP Temperature (° C.)" in TABLE 1 and TABLE 2 is a heating temperature (set temperature) of the hot plate.

The "Filament Temperature (° C.)" in TABLE 1 and TABLE 2 was measured with a noncontact thermometer (IR-AHS, produced by CHINO Corporation) with an emissivity of a tungsten filament of 0.39. Output of the infrared heater was adjusted to be the temperatures shown in TABLE 1 and TABLE 2.

The "Ratio of Spectral Radiance (%)" at a wavelength of 5.8 µm to spectral radiance at a wavelength of 3.0 µm in TABLE 1 and TABLE 2 was obtained by the following method.

The temperature of a standard black body furnace (M390, produced by Mikron) was adjusted to the measured filament temperature of the infrared heater, and radiation output of the standard black body furnace and radiation output of the infrared heater were measured with a measurement wavenumber of 7,800 to 350 cm$^{-1}$, a resolution of 4 cm$^{-1}$ and a cumulative number of 32 using FT-IR (FT/IR-4100, produced by JASCO Corporation), so that the spectral emissivity of the infrared heater was obtained.

Next, the black body radiation spectrum at the same temperature as that of the standard black body furnace was obtained in accordance with Planck's law, and multiplied by the spectral emissivity of the infrared heater, whereby the spectrum of the infrared heater was obtained.

From the obtained spectrum of the infrared heater, a value of the spectral radiance at a wavelength of 3.0 μm and a value of the spectral radiance at a wavelength of 5.8 μm were read, and a ratio of the spectral radiance at a wavelength of 5.8 μm to the spectral radiance at a wavelength of 3.0 μm was calculated in percentage.

(4) Evaluation of Samples

With respect to each of the transparent electrode samples, properties (drying property, thickness distribution and base stability) thereof were evaluated as described below.

(4.1) Drying Property

For the drying property of the conductive polymer layer, the surface of the applied layer was examined by touch and evaluated according to the following criteria.
  ○ (circle): feel not sticky but dry
  Δ (triangle): feel sticky
  x (cross): applied layer is separated, and solution still exists (4.2) Thickness Distribution For the thickness distribution (smoothness) of the conductive polymer layer, interference fringes on the surface of the applied layer were visually observed and evaluated according to the following criteria.
  ⊚ (double circle): no interference fringes
  ○ (circle): almost no interference fringes
  Δ (triangle): weak interference fringes
  x (cross): strong interference fringes (4.3) Base Stability As evaluation of damage to the transparent resin substrate by the dry treatment, base deformation was evaluated according to the following criteria.
  ○ (circle): no deformation
  Δ (triangle): curved a little, but substrate is freely bendable
  x (cross): curved greatly, and substrate is unbendable at curved part
  xx (double cross): substrate has partially melted and deformed

TABLE 1

| | | | | DRYING CONDITION | | | | |
|---|---|---|---|---|---|---|---|---|
| | CONDUCTIVE POLYMER LAYER | | | DRYING | *2 | *3 | RATIO OF SPECTRAL RADIANCE | TREATMENT TIME |
| No. | *1 | SOLVENT-1 | SOLVENT-2 | METHOD | [° C.] | [° C.] | [%] | [min.] |
| 101 | Z-561 | DMSO | EGBu | HP | 100 | — | — | 10 |
| 102 | Z-690 | EG | PGPr | | 100 | — | — | 10 |
| 103 | Z-561 | DMSO | EGBu | | 100 | — | — | 30 |
| 104 | Z-561 | PG | PGPr | | 100 | — | — | 30 |
| 105 | Z-690 | DMSO | EGBu | | 130 | — | — | 10 |
| 106 | Z-561 | DMSO | PGPr | | 130 | — | — | 15 |
| 107 | PHEA | EG | EGBu | | 130 | — | — | 30 |
| 108 | Z-561 | DMSO | EGBu | IR-1 | — | 800 | 19 | 30 |
| 109 | Z-690 | EG | EGBu | | — | 800 | 19 | 30 |
| 110 | Z-561 | DMSO | EGBu | | — | 800 | 19 | 20 |
| 111 | Z-690 | DMSO | PGPr | | — | 800 | 19 | 20 |
| 112 | PHEA | DMSO | EGBu | | — | 800 | 19 | 10 |
| 113 | PHEA | EG | EGBu | | — | 800 | 19 | 10 |
| 114 | Z-561 | DMSO | EGBu | | — | 1500 | 9 | 15 |
| 115 | Z-690 | EG | EGBu | | — | 1500 | 9 | 15 |
| 116 | Z-561 | DMSO | EGBu | | — | 1500 | 9 | 30 |
| 117 | Z-690 | EG | EGBu | | — | 1500 | 9 | 30 |
| 118 | Z-561 | DMSO | EGBu | | — | 2200 | 7 | 5 |
| 119 | PHEA | DMSO | EGBu | | — | 2200 | 7 | 5 |

| | EVALUATION | | | |
|---|---|---|---|---|
| No. | DRYING PROPERTY | THICKNESS DISTRIBUTION | BASE DEFORMATION | REMARK |
| 101 | Δ | X | ○ | *4 |
| 102 | Δ | X | ○ | *4 |
| 103 | ○ | X | ○ | *4 |
| 104 | ○ | X | ○ | *4 |
| 105 | ○ | X | Δ | *4 |
| 106 | ○ | X | Δ | *4 |
| 107 | ○ | X | X | *4 |
| 108 | Δ | ○ | Δ | *4 |
| 109 | ○ | ○ | Δ | *4 |
| 110 | Δ | ○ | Δ | *4 |
| 111 | ○ | ○ | Δ | *4 |
| 112 | Δ | ○ | ○ | *4 |
| 113 | Δ | ○ | ○ | *4 |

TABLE 1-continued

|     |   |   |    |    |
|-----|---|---|----|----|
| 114 | ○ | ○ | X  | *4 |
| 115 | ○ | ○ | X  | *4 |
| 116 | ○ | ○ | XX | *4 |
| 117 | ○ | ⊙ | XX | *4 |
| 118 | ○ | ○ | X  | *4 |
| 119 | ○ | ○ | X  | *4 |

*1: NONCONDUCTIVE POLYMER
*2: HP TEMPERATURE
*3: FILAMENT TEMPERATURE
*4: COMPARATIVE EXAMPLE

TABLE 2

| No. | *1 | CONDUCTIVE POLYMER LAYER SOLVENT-1 | CONDUCTIVE POLYMER LAYER SOLVENT-2 | DRYING METHOD | *2 [°C.] | *3 [°C.] | *4 [%] | TREATMENT TIME [min.] |
|---|---|---|---|---|---|---|---|---|
| 120 | Z-561 | DMSO | EGBu | IR-2 | — | 800 | 4.5 | 30 |
| 121 | Z-561 | EG | EGBu |  | — | 800 | 4.5 | 30 |
| 122 | PHEA | DMSO | EGBu |  | — | 800 | 4.5 | 30 |
| 123 | PHEA | EG | PGPr |  | — | 800 | 4.5 | 30 |
| 124 | Z-561 | DMSO | EGBu |  | — | 800 | 4.5 | 20 |
| 125 | Z-690 | EG | PGPr |  | — | 800 | 4.5 | 20 |
| 126 | PHEA | DMSO | PGPr |  | — | 800 | 4.5 | 20 |
| 127 | PHEA | EG | EGBu |  | — | 800 | 4.5 | 20 |
| 128 | Z-561 | DMSO | EGBu |  | — | 800 | 4.5 | 10 |
| 129 | Z-690 | EG | PGPr |  | — | 800 | 4.5 | 10 |
| 130 | PHEA | DMSO | PGPr |  | — | 800 | 4.5 | 10 |
| 131 | PHEA | EG | EGBu |  | — | 800 | 4.5 | 10 |
| 132 | Z-561 | DMSO | PGPr |  | — | 1500 | 1.0 | 10 |
| 133 | Z-561 | PG | EGBu |  | — | 1500 | 1.0 | 10 |
| 134 | Z-690 | PG | PGPr |  | — | 1500 | 1.0 | 10 |
| 135 | PHEA | PG | EGBu |  | — | 1500 | 1.0 | 10 |
| 136 | Z-561 | DMSO | EGBu |  | — | 1500 | 1.0 | 10 |
| 137 | Z-690 | EG | PGPr |  | — | 1500 | 1.0 | 10 |
| 138 | PHEA | EG | EGBu |  | — | 1500 | 1.0 | 10 |
| 139 | Z-561 | PG | PGPr |  | — | 2200 | 0.2 | 10 |
| 140 | Z-561 | DMSO | EGBu |  | — | 2200 | 0.2 | 10 |
| 141 | Z-561 | PG | EGBu |  | — | 2200 | 0.2 | 10 |
| 142 | Z-690 | PG | EGBu |  | — | 2200 | 0.2 | 10 |

| No. | EVALUATION DRYING PROPERTY | EVALUATION THICKNESS DISTRIBUTION | EVALUATION BASE DEFORMATION | REMARK |
|---|---|---|---|---|
| 120 | ○ | ○ | ○ | *5 |
| 121 | ○ | ○ | ○ | *5 |
| 122 | ○ | ○ | ○ | *5 |
| 123 | ○ | ○ | ○ | *5 |
| 124 | ○ | ○ | ○ | *5 |
| 125 | ○ | ○ | ○ | *5 |
| 126 | ○ | ○ | ○ | *5 |
| 127 | ○ | ○ | ○ | *5 |
| 128 | ○ | ○ | ○ | *5 |
| 129 | ○ | ○ | ○ | *5 |
| 130 | ○ | ○ | ○ | *5 |
| 131 | ○ | ○ | ○ | *5 |
| 132 | ○ | ○ | ○ | *5 |
| 133 | ○ | ⊙ | ○ | *5 |
| 134 | ○ | ⊙ | ○ | *5 |
| 135 | ○ | ⊙ | ○ | *5 |
| 136 | ○ | ○ | ○ | *5 |
| 137 | ○ | ⊙ | ○ | *5 |
| 138 | ○ | ⊙ | ○ | *5 |
| 139 | ○ | ⊙ | ○ | *5 |
| 140 | ○ | ○ | ○ | *5 |
| 141 | ○ | ⊙ | ○ | *5 |
| 142 | ○ | ⊙ | ○ | *5 |

*1: NONCONDUCTIVE POLYMER
*2: HP TEMPERATURE
*3: FILAMENT TEMPERATURE
*4: RATIO OF SPECTRAL RADIANCE
*5: PRESENT INVENTION (5) Conclusion As shown in TABLE 1 and TABLE 2, the transparent electrode samples 120 to 142 produced by irradiation with the infrared rays of the present invention were more excellent than the samples 101 to 119 as comparative examples in all the drying property of the conductive polymer layer, the thickness uniformity thereof and the base stability.

SECOND EXAMPLE (1) Production of Organic EL Element (Samples)

Organic EL element samples 201 to 242 were produced using the transparent electrodes 101 to 142 produced in First Example, respectively, by the method described below.

(1.1) Formation of Organic Functional Layer

On each transparent electrode, an organic functional layer (composed of a positive hole transport layer, a luminescent layer, a positive hole block layer and an electron transport layer) was formed as described below.

The organic functional layer was formed by vapor deposition. Vapor-deposition crucibles of a commercially-available vacuum deposition device were filled with materials for the respective constitutive layers at their respective optimum amounts to produce an element. The vapor-deposition crucibles used were made of a material for resistance heating, such as molybdenum or tungsten.

(1.1.1) Formation of Positive Hole Transport Layer

After the pressure was reduced to a vacuum of $1\times10^{-4}$ Pa, the vapor-deposition crucible having Compound 1 therein was electrically heated, and Compound 1 below was deposited on the transparent electrode at a deposition rate of 0.1 nm/sec. Thus, the positive hole transport layer having a thickness of 30 nm was formed. (See FIG. 6D.)

(1.1.2) Formation of Luminescent Layer

Next, the luminescent layer was formed according to the procedure described below.

On the formed positive hole transport layer, Compound 2, Compound 3 and Compound 5 below were co-deposited at a deposition rate of 0.1 nm/sec in such away that Compound 2 was 13 percent by mass, Compound 3 was 3.7 percent by mass and Compound 5 was 83.3 percent by mass in concentration. Thus, a green-and-red phosphorescent layer having a maximum emission wavelength of 622 nm and a thickness of 10 nm was formed. (See FIG. 6D.)

Next, Compound 4 and Compound 5 below were co-deposited at a deposition rate of 0.1 nm/sec in such a way that Compound 4 was 10.0 percent by mass and Compound 5 was 90.0 percent by mass in concentration. Thus, a blue phosphorescent layer having a maximum emission wavelength of 471 nm and a thickness of 15 nm was formed. (See FIG. 6D.)

(1.1.3) Formation of Positive Hole Block Layer

On the formed luminescent layer, Compound 6 below was deposited. Thus, the positive hole block layer having a thickness of 5 nm was formed. (See FIG. 6D.)

(1.1.4) Formation of Electron Transport Layer

Next, on the formed positive hole block layer, CsF and Compound 6 were co-deposited in such a way that CsF was 10% in layer thickness ratio. Thus, the electron transport layer having a thickness of 45 nm was formed. (See FIG. 6D.)

[Chem. 4]

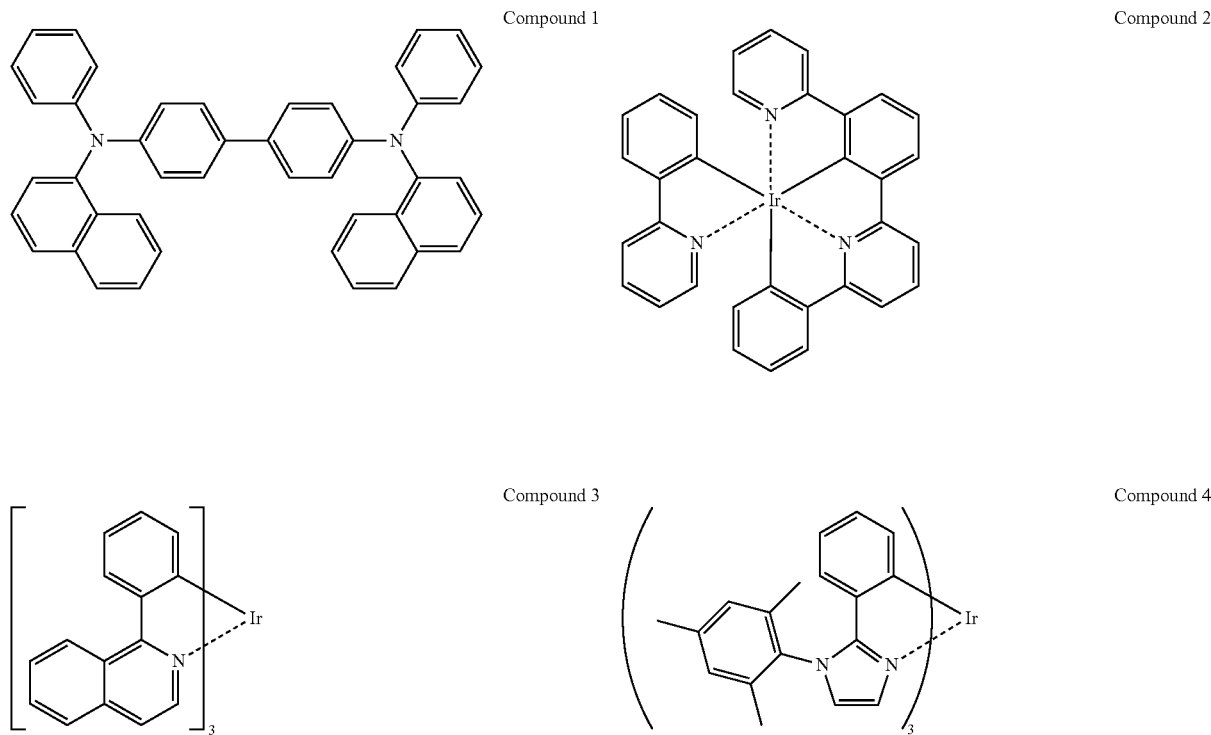

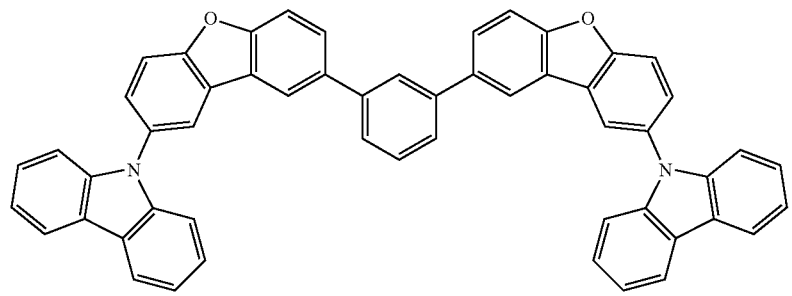

Compound 5

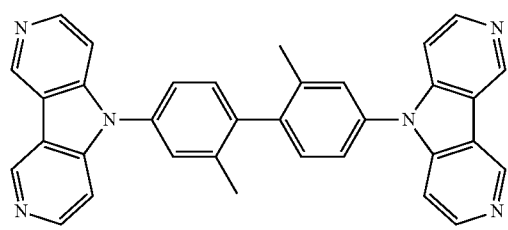

Compound 6

(1.2) Formation of Counter Electrode

On the formed electron transport layer, as a material for forming extraction electrodes and a counter electrode (cathode), Al was deposited with a mask under a vacuum of $5\times10^{-4}$ Pa. Thus, a counter electrode having a thickness of 100 nm was formed.

(1.3) Sealing by Sealing Member

An adhesive was applied to around the counter electrode in such a way that extraction electrodes (external extraction terminals) were formed, a flexible sealing member composed of $Al_2O_3$ deposited to be 300 nm thick on a polyethylene terephthalate resin film was glued to the portion where the adhesive was applied, and the adhesive was cured by heat treatment (sealing was carried out). Thus, each of the organic EL elements 201 to 242 was produced.

As the adhesive, one composed of two-component epoxy resins 2016B and 2103 (produced by ThreeBond Group) mixed at a ratio of 100:3 was used.

(2) Evaluation of Samples

With respect to each of the organic EL element samples, properties (power efficiency, emission uniformity (emission unevenness), emission lifetime and dark spots) thereof were evaluated as described below.

(2.1) Power Efficiency

An organic EL element 200 was produced as a reference sample in the same way as the organic EL element 201 except that the transparent electrode 101 as the anode was changed to an anode composed of a patterned ITO electrode formed by the following method.

<Formation of Anode of Reference Sample>

On the transparent resin substrate having the barrier layer, ITO (indium-tin composite oxide) was deposited to be 110 nm thick and subjected to patterning to form an anode, and then the transparent resin substrate provided with this ITO transparent electrode was subjected to ultrasonic cleaning with isopropyl alcohol, dried with a dry nitrogen gas, and subjected to UV ozone cleaning for five minutes. Thus, the anode was produced.

With respect to each of the reference organic EL element 200 and the organic EL elements 201 to 242, front luminance and luminance angle dependency were measured with a spectroradiometer CS-1000 (produced by Konica Minolta Sensing Inc.). Power efficiency (lm/w) was measured from driving voltage and current with which the front luminance became 1,000 $cd/m^2$.

Next, relative power efficiency to the power efficiency of the reference organic EL element 200 as 100% was obtained, and the relative power efficiency was evaluated according to the following criteria.

The evaluation result is shown in TABLE 3.

⊚ (double circle): relative power efficiency of 150% or more

○ (circle): relative power efficiency of 100% or more and less than 150%

Δ (triangle): relative power efficiency of 80% or more and less than 100% x (cross): relative power efficiency of 50% or more and less than 80% xx (double cross): relative power efficiency of less than 50%

(2.2) Emission Uniformity

After the reference organic EL element 200 and the organic EL elements 201 to 242 were heated with an oven at 60% RH and 80° C. for five hours and then humidity-controlled under the environment of 23±3° C. and 55±3% RH for one hour or more, a DC voltage was applied to the organic EL elements using a source measure unit Model 2400 produced by Keithley Instruments so that the organic EL elements emitted light.

With respect to each of the reference organic EL element 200 and the organic EL elements 201 to 242 which were made to emit light at 1,000 $cd/m^2$, luminance unevenness in the emission was observed under a microscope with a magnification of 50 times and evaluated according to the following criteria. The evaluation result is shown in TABLE 3.

⊚ (double circle): nothing to say but perfect with completely uniform emission

○ (circle): no problem with almost uniform emission

Δ (triangle): acceptable with some uneven emission partially x (cross): unacceptable with uneven emission over the entire surface (2.3) Emission Lifetime With respect to each of the reference organic EL element 200 and the organic EL elements 201 to 242, the organic EL element was made to continuously emit light at an initial luminance of 5,000 cd/m$^2$, the voltage was fixed, and time for the luminance to decrease by half was obtained. A ratio of the above-described time to that of the reference organic EL element 200 having the anode composed of ITO was obtained and evaluated according to the following criteria. The evaluation result is shown in TABLE 3. The ratio is preferably 100% or more and far preferably 150% or more.

⊚ (double circle): 150% or more
○ (circle): 100% or more and less than 150%
Δ (triangle): 80% or more and less than 100%
x (cross): less than 80%

(2.4) Dark Spots

As evaluation of reduction in the barrier function, after the reference organic EL element 200 and the organic EL elements 201 to 242 were heated with an oven under the conditions of 60% RH and 80° C. for 10 hours and then humidity-controlled under the environment of 23±3° C. and 55±3% RH for one hour, the generation degree (number and size) of dark spots (DS) was examined and evaluated according to the following criteria. The evaluation result is shown in TABLE 3.

⊚ (double circle): 10 or less fine DSs (diameter of 0 to 0.5 mm)
○ (circle): 30 or less fine DSs and 10 or less small DSs (diameter of 0.5 to 1 mm)
Δ (triangle): 11 or more small DSs and five or less large DSs (diameter of 1 mm or more)
x (cross): six or more large DSs

TABLE 3

| | POWER EFFICIENCY | EMISSION UNIFORMITY | EMISSION LIFETIME | DS | REMARK |
|---|---|---|---|---|---|
| 200 | X | Δ | Δ | ○ | REFERENCE |
| 201 | | ✗ NO LIGHT EMITTED | | | COMPARATIVE EXAMPLE |
| 202 | | ✗ NO LIGHT EMITTED | | | COMPARATIVE EXAMPLE |
| 203 | XX | X | X | X | COMPARATIVE EXAMPLE |
| 204 | XX | X | X | X | COMPARATIVE EXAMPLE |
| 205 | XX | X | X | X | COMPARATIVE EXAMPLE |
| 206 | XX | X | X | X | COMPARATIVE EXAMPLE |
| 207 | | ✗ UNABLE TO MAKE ELEMENT DUE TO DAMAGE TO BASE | | | COMPARATIVE EXAMPLE |
| 208 | X | Δ | X | X | COMPARATIVE EXAMPLE |
| 209 | Δ | Δ | Δ | X | COMPARATIVE EXAMPLE |
| 210 | X | X | X | X | COMPARATIVE EXAMPLE |
| 211 | X | X | Δ | X | COMPARATIVE EXAMPLE |
| 212 | X | X | X | X | COMPARATIVE EXAMPLE |
| 213 | X | X | X | X | COMPARATIVE EXAMPLE |
| 214 | | ✗ UNABLE TO MAKE ELEMENT DUE TO DAMAGE TO BASE | | | COMPARATIVE EXAMPLE |
| 215 | | ✗ UNABLE TO MAKE ELEMENT DUE TO DAMAGE TO BASE | | | COMPARATIVE EXAMPLE |
| 216 | | ✗ UNABLE TO MAKE ELEMENT DUE TO DAMAGE TO BASE | | | COMPARATIVE EXAMPLE |
| 217 | | ✗ UNABLE TO MAKE ELEMENT DUE TO DAMAGE TO BASE | | | COMPARATIVE EXAMPLE |
| 218 | | ✗ UNABLE TO MAKE ELEMENT DUE TO DAMAGE TO BASE | | | COMPARATIVE EXAMPLE |
| 219 | | ✗ UNABLE TO MAKE ELEMENT DUE TO DAMAGE TO BASE | | | COMPARATIVE EXAMPLE |
| 220 | ○ | ○ | ○ | ○ | PRESENT INVENTION |
| 221 | ○ | ○ | ⊚ | ⊚ | PRESENT INVENTION |
| 222 | ○ | ○ | ○ | ○ | PRESENT INVENTION |
| 223 | ○ | ○ | ○ | ○ | PRESENT INVENTION |
| 224 | ○ | ○ | ○ | ○ | PRESENT INVENTION |
| 225 | ○ | ○ | ⊚ | ○ | PRESENT INVENTION |
| 226 | ○ | ○ | ○ | ○ | PRESENT INVENTION |
| 227 | ○ | ○ | ○ | ○ | PRESENT INVENTION |
| 228 | ○ | ○ | ○ | ○ | PRESENT INVENTION |
| 229 | ○ | ○ | ○ | ○ | PRESENT INVENTION |
| 230 | ○ | ○ | ○ | ○ | PRESENT INVENTION |
| 231 | ○ | ○ | ○ | ○ | PRESENT INVENTION |
| 232 | ○ | ○ | ○ | ○ | PRESENT INVENTION |
| 233 | ○ | ⊚ | ⊚ | ○ | PRESENT INVENTION |
| 234 | ○ | ⊚ | ⊚ | ○ | PRESENT INVENTION |
| 235 | ○ | ⊚ | ○ | ○ | PRESENT INVENTION |
| 236 | ○ | ○ | ○ | ○ | PRESENT INVENTION |
| 237 | ○ | ⊚ | ⊚ | ○ | PRESENT INVENTION |
| 238 | ○ | ⊚ | ○ | ○ | PRESENT INVENTION |
| 239 | ⊚ | ⊚ | ○ | ⊚ | PRESENT INVENTION |
| 240 | ⊚ | ○ | ⊚ | ○ | PRESENT INVENTION |
| 241 | ⊚ | ⊚ | ○ | ⊚ | PRESENT INVENTION |
| 242 | ⊚ | ⊚ | ⊚ | ⊚ | PRESENT INVENTION |

(3) Conclusion

As shown in TABLE 3, the organic EL element samples 220 to 242 using the transparent electrodes produced by irradiation with the infrared rays of the present invention were more excellent than the samples 201 to 219 as comparative examples in all the element's power efficiency, emission uniformity and emission lifetime.

Further, it is understood that drying by irradiation with the infrared rays of the present invention can produce a transparent electrode which generates few dark spots through a degradation test and accordingly does not reduce the function of a barrier layer.

INDUSTRIAL APPLICABILITY

The present invention relates to a method for producing a transparent electrode and can be particularly suitably used to satisfy thickness uniformity, smoothness and patterning accuracy of a transparent conductive layer and also to highly dry the transparent conductive layer without deforming a transparent resin substrate.

DESCRIPTION OF REFERENCE NUMERALS

1 Transparent Electrode
2 Transparent Resin Substrate
4 Conductive Metal Layer
6 Conductive Polymer Layer
20 Infrared Heater
22 Filament
24 Protective Tube
26, 28 Filter
30 Hollow Part
32 Reflective Plate
40 Cooling Mechanism
50 Control Device
60 Organic EL Element
62 Extraction Electrode
64 Organic Functional Layer
66 Counter Electrode
68 Sealing Member

The invention claimed is:

1. An organic EL element comprising:
a transparent electrode produced by forming a conductive metal layer on a transparent resin substrate, applying a composition containing a conductive polymer and a nonconductive polymer over the transparent resin substrate and the conductive metal layer so as to form a conductive polymer layer, and irradiating the conductive polymer layer with an infrared ray having a ratio of spectral radiance at a wavelength of 5.8 µm to spectral radiance at a wavelength of 3.0 µm of 5% or less, wherein the conductive metal layer and the conductive polymer layer are formed on the transparent resin substrate so that side edge parts of the transparent resin substrate are not covered by the conductive metal layer and the conductive polymer layer;
a counter electrode facing the transparent electrode;
an organic functional layer disposed between the transparent electrode and the counter electrode, and
extraction electrodes formed on the side edge parts of the transparent resin substrate and being in electrically conductive contact with the conductive metal layer and the conductive polymer layer.

2. The organic EL element of claim 1, further comprising a sealing member contacting the extraction electrodes and covering the transparent electrode and the organic functional layer.

* * * * *